US006775799B1

(12) United States Patent
Giorgetta et al.

(10) Patent No.: US 6,775,799 B1
(45) Date of Patent: Aug. 10, 2004

(54) PROTOCOL INDEPENDENT PERFORMANCE MONITOR WITH SELECTABLE FEC ENCODING AND DECODING

(75) Inventors: Timothy E. Giorgetta, San Diego, CA (US); Alan M. Sorgi, San Diego, CA (US); Daniel M. Castagnozzi, Lexington, MA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/527,349

(22) Filed: Mar. 17, 2000

(51) Int. Cl.[7] .............................................. H03M 13/00
(52) U.S. Cl. ......................... 714/751; 714/704; 714/784
(58) Field of Search ................................ 714/751, 752, 714/746, 704, 784, 776

(56) References Cited

U.S. PATENT DOCUMENTS

| 4,541,091 | A | * | 9/1985 | Nishida et al. ............. 714/756 |
| 5,251,205 | A | | 10/1993 | Callon et al. ................. 370/60 |
| 5,392,300 | A | * | 2/1995 | Borth et al. |
| 5,490,252 | A | | 2/1996 | Macera et al. ......... 395/200.01 |
| 5,568,471 | A | | 10/1996 | Hershey et al. ............... 370/17 |
| 5,982,743 | A | * | 11/1999 | Kusano ....................... 370/217 |
| 6,487,686 | B1 | * | 11/2002 | Yamazaki et al. .......... 714/703 |

* cited by examiner

*Primary Examiner*—Phung M. Chung
(74) *Attorney, Agent, or Firm*—INCAPLAW; Terrance A. Meador

(57) ABSTRACT

A method for monitoring the performance of digital communications has been provided which selectively performs Forward Error Corrections (FEC)s on the monitored data. In addition to selectively performing FEC, the process selectively decodes input data, and selectively encodes data for transmission. The decoding, FEC, and encoding operations can also be combined. Further, the process selectively performs evaluations of SONET/SDH protocol communications, Gigabit Ethernet (GBE), and other fiber channel communications, in addition to the selective decode/FEC/encode processes. An apparatus and system to enable the above-mentioned selective monitoring process has also been provided.

33 Claims, 18 Drawing Sheets

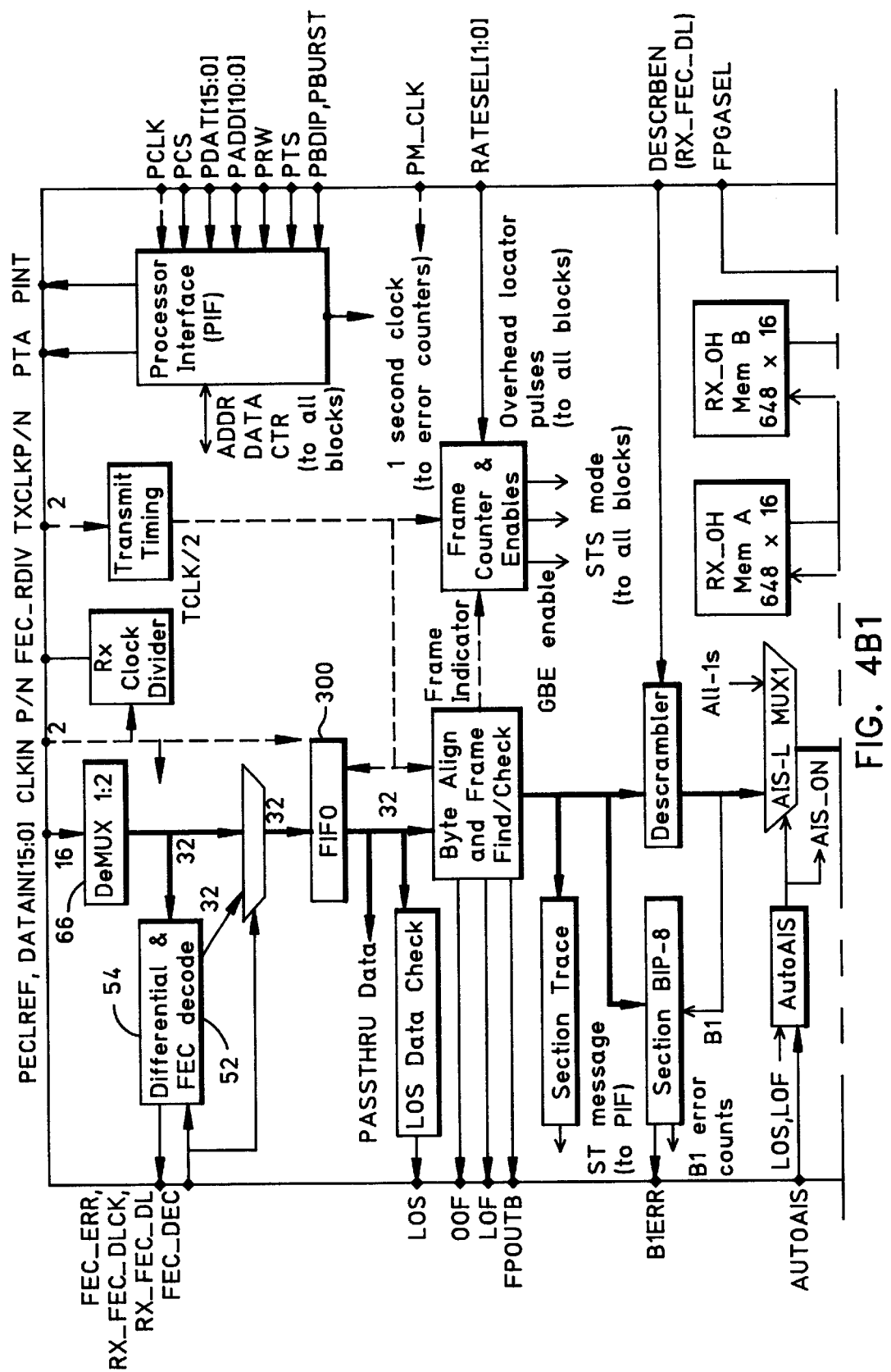
FIG. 4B1

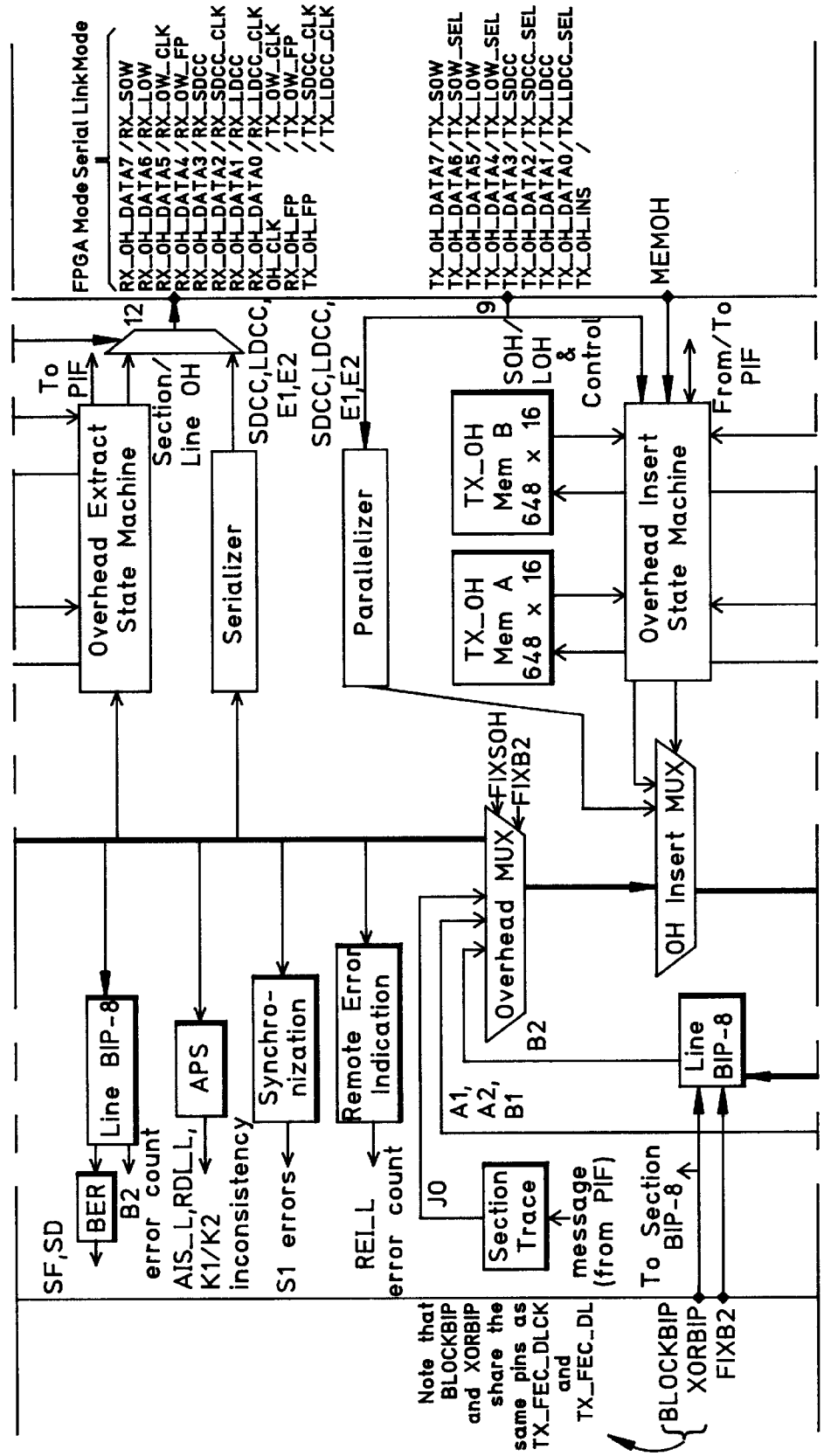
FIG. 4B2

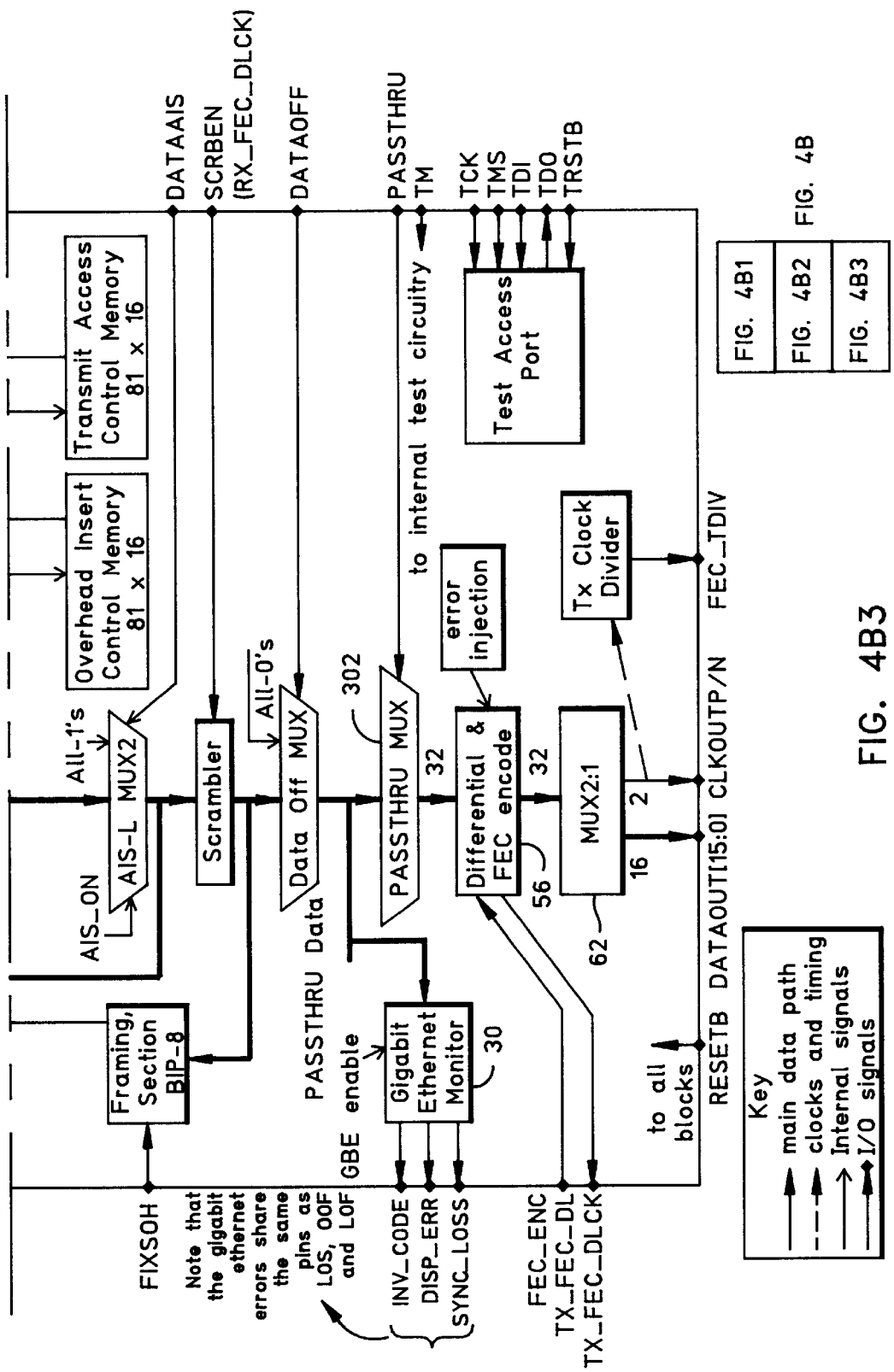
FIG. 4B3

PROTOCOL INDEPENDENT PERFORMANCE MONITOR WITH SELECTABLE FEC ENCODING AND DECODING

BACKGROUND OF THE INVENTION

This invention relates generally to communication circuitry and, more particularly, to a system and method for monitoring and correcting messages in fiber optic channel and Internet-related protocol communications.

Increasing data rates push the limits of existing data transmission techniques. Shorter fiber sections are often used in current installed fiber links due to greater signal attenuation at higher frequencies. Thus, more regenerators are required, more points of failure exist, and it becomes more expensive to build and maintain networks. Alternately, greater transmit powers are required to combat line attenuation, resulting in higher equipment power demands, more expensive equipment, and lower reliability.

Some of these problems are addressed using Forward Error Correction (FEC) techniques such as those commonly used in wireless communications, CD players, and other consumer equipment. The use of FEC permits longer distances between line regenerators for a fixed transmission speed, higher rates travelling the same fibers and distances that lower speed transmissions once occupied, and reduced bit error rates (BER) given a fixed power or TX rate. However, the capacity to make corrections requires an increase (~7%) in data bandwidth and the development of more complex processing equipment.

Reed Solomon (RS) is one of the most widely used FEC codes. Its strengths are that it works on symbols instead of bits, and works well in a short burst error environment, where burst errors are a string of consecutive errors. The high coding gain results in improved BER performance. However, RS does not handle impulse errors very well, where impulse errors are large blocks of data corruption that occur randomly, but in longer strings than the FEC code can handle.

In SONET/SDH and Gigabit Ethernet (GBE) transmissions it is not always practical for communication repeater transmission systems to perform error correction. Overall system performance could be improved, however, if messages with unacceptable errors could be terminated instead of retransmitted. Further, it would be helpful if the system repeater equipment could perform error analysis to track communication problems to faulty lines and equipment.

It would be advantageous if additional FEC protection could be added to communication links without adding additional equipment, delay times, or inordinately large increases in bandwidth.

It would be advantageous if FEC protection could be added to communications, regardless of the communications protocol and data rates.

It would be advantageous if the above-mentioned FEC protection used a RS technique that had improved resilience to impulse errors.

It would be advantageous if SONET/SDH communications could be monitored, transparent to the retransmission process. Further, it would be useful if the monitoring process yielded an analysis of communication errors.

It would be advantageous if GBE communications could be monitored, transparent to the retransmission process. Further, it would be useful if the monitoring process yielded an analysis of communication errors.

SUMMARY OF THE INVENTION

Accordingly, a method is provided for monitoring information independent of communication protocols. The method comprising:

receiving information in a plurality of communication protocols;

optionally decoding the information;

independently of whether the information has been decoded, optionally engaging a Forward Error Correction (FEC) process;

independently of whether the information has been decoded or corrected, optionally encoding the information;

optionally monitoring the performance of the FEC processing, when it is engaged; :

independently of whether the information has been decoded or corrected, optionally monitoring the information for SONET/SDH protocol errors; and independently of whether the information has been decoded or corrected, optionally monitoring the information for GBE protocol and fiber channel errors.

A performance monitor circuit is also provided. The performance monitor comprises an input port to accept information, and a selectably enabled Forward Error Correction (FEC) circuit to receive information. The FEC circuit provides corrected information, independent of the information protocol, when the FEC is enabled.

A selectively enabled decoding circuit accepts information and provides decoded information when the decoding circuit is enabled. The input of the FEC circuit is selectively connectable to the output of the decoder circuit.

A selectively enabled encoding circuit is connected to the input port, to the outputs of the selectively engagable decoder circuit, or to the FEC circuit to provide encoded information when the encoding circuit is enabled.

A selectively enabled FEC performance monitor circuit is connected to the monitor port of the selectively enabled FEC circuit to evaluate the corrections being made by the FEC circuit when it is engaged.

A selectively enabled SONET/SDH performance monitoring circuit is connected to the input port, or to the output of the selectively enabled FEC circuit. The SONET/SDH performance monitoring circuit providing an analysis of SONET/SDH protocol errors when enabled.

A selectively enabled Gigabit Ethernet performance monitoring circuit is connected to the input port, or to the output of the selectively enabled FEC circuit. The GBE performance monitoring circuit providing an analysis of GBE and fiber channel protocol errors at a monitor port, when enabled.

BRIEF DESCRIPTION OF THE DRAWINGS

FIGS. 4a and 4b are more detailed schematic block diagrams illustrating the present invention of FIG. 3.

DETAILED DESCRIPTION OF THE PREFERRED EMBODIMENT

The principles of the present invention performance monitor have been specifically embodied in an integrated circuit (IC), namely, the AMCC S3062 Performance Monitor. Aspects of the invention are demonstrated using the S3062 as an example. However, the present invention is not necessarily limited to any particular embodiments implemented in this IC.

The S3062 Multi-Rate SONET/SDH STS-3/STM-1, STS-12/STM-4, STS-48/STM-16 & Gigabit Ethernet (GBE) Performance Monitor chip is a fully integrated checking device complying with SONET/SDH transmission standards. The S3062 implements all necessary performance monitoring functions on the SONET/SDH section and line overhead bytes at three different rates (STS-3/STM-1, STS-12/STM-4, and STS-48/STM-16). It also has a mode of operation permitting it to monitor a Gigabit Ethernet data stream for loss of synchronization, 8B/10B code violations and disparity errors. Furthermore, any type of data entering and leaving the chip can be optionally decoded and encoded with forward error correction (FEC) information and also differentially encoded and decoded.

Figures 1, 2:
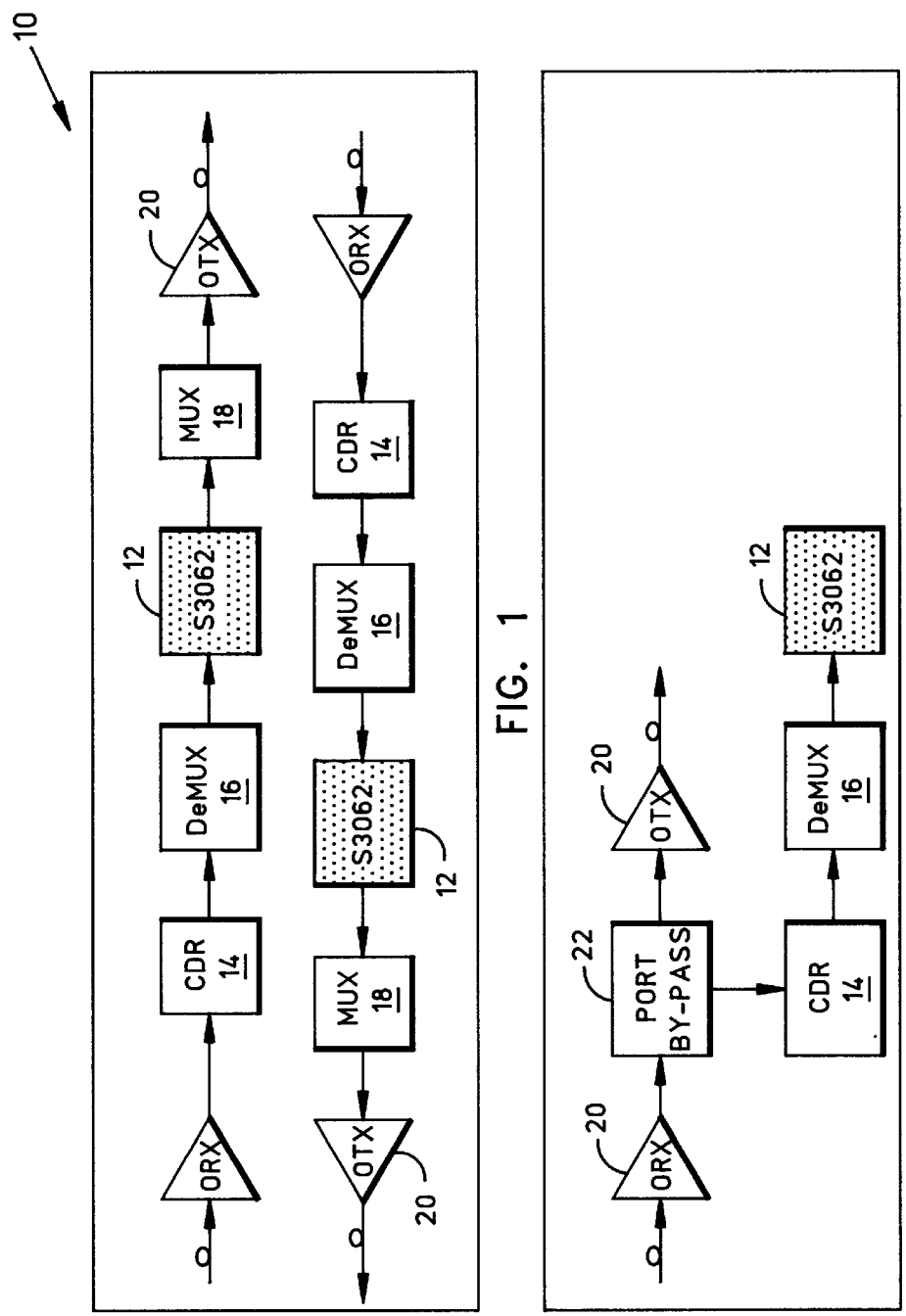
FIG. 1 illustrates an exemplary network including a performance monitoring device of the present invention.
FIG. 2 depicts the performance monitor device of FIG. 1, performing an exemplary monitoring function.

FIG. 1 illustrates an exemplary network 10 including a performance monitoring device 12 of the present invention. Data is received from an optic fiber and passed through a clock/data recovery device (CDR) 14 and a demultiplexer device 16 to the S3062. The S3062 (12), optionally, carries out performance monitor error checking, and overhead data extraction, and insertion. Detected errors and accumulated error counts can be accessed by the user either through a processor interface, an FPGA interface, or in a number of cases, from I/O pins (not explicitly shown). The data stream is then transmitted out onto the fiber via a high-speed multiplexer 18, and an optics device 20. All SONET/GBE performance monitor error checking and overhead insertion may be by-passed by selecting the low-power pass-through mode of operation.

FIG. 2 depicts the performance monitor device of FIG. 1, performing an exemplary monitoring function. The S3062 (12) is being used to monitor data, without inserting overhead. In this application, the MUX 18 may be removed and a Port By-Pass circuit 22 added for a low power monitoring solution.

The S3062 is used, but not necessarily limited to use, in the following applications:

1) SONET/SDH-based transmission systems and test equipment;

2) Gigabit Ethernet-based transmission systems;

3) Add Drop Multiplexers (ADM);

4) Fiber optic terminators, repeaters and test equipment; and

5) FEC augmented applications for reliable data transmission over impaired channels.

The following is a list of S3062 features which are explained in greater detail, below:

1) Provides a 16 bit input and a 16 bit output single-ended PECL data path;

2) Optionally differentially decodes and encodes incoming and outgoing data;

3) Provides optional Reed Solomon (RS) encoding of data for Forward Error Correction (FEC);

4) Provides optional Reed Solomon decoding of data for Forward Error Correction (FEC);

5) Provides on-chip clock dividers to simplify external clock generation for Forward Error Correction (FEC);

6) Optionally provides a data link in the FEC framing bytes for transmission of messages, error information, orderwire, etc.;

7) Provides selectable error correcting rates;

8) Monitors FEC data for total corrected bit errors, corrected ones, corrected zeros, corrected bytes, and uncorrectable blocks;

9) Extracts and optionally inserts SONET/SDH overhead bytes via a microprocessor port;

10) Extracts and optionally, inserts SONET/SDH overhead bytes via a FPGA port;

11) Extracts and optionally inserts orderwire bytes (E1 and E2) via serial I/O;

12) Extracts and optionally inserts the data communication channels (D1–3 and D4–12) via serial I/O;

13) Performs frame and byte alignment and outputs frame pulses;.

14) Performs optional frame-synchronous scrambling and descrambling;

15) Monitors for Loss of Signal and outputs alarm (LOS);

16) Monitors for Out of Frame and outputs alarm (OOF);

17) Monitors for Loss of Frame and outputs alarm (LOF);

18) Monitors J0 byte for section trace messages;

19) Monitors B1 byte for Bit Interleave parity errors and outputs error indications (B1ERR);

20) Monitors B2 byte for Bit interleave parity errors, Signal Degrade (SD) and Signal Fail (SF);

21) Monitors K1, K2 bytes for Automatic Protection Switching (APS) changes, line AIS and line RDI;

22) Monitors the S1 byte for mismatches and inconsistent values;

23) Monitors the M1 byte for Remote Error Indications (REI);

24) Monitors for Gigabit Ethernet Loss of Synchronization (LOS), 8B/10B code violations and disparity errors;

25) Optionally calculates and inserts section bit interleaved parity (B1);

26) Optionally calculates and inserts line bit interleaved parity (B2);

27) Optionally turns OFF (sets low) all transmitted data;

28) Optionally inserts AIS, either automatically depending on line conditions or under user control;

29) Optionally inserts valid SONET/SDH section and line overhead on any data format with a CLKINP/N and TXCLKP/N input;

30) Generates valid SONET/SDH section (regenerator) overhead with line AIS data with only a TXCLKP/N input;

31) Optionally permits transparent pass through of all data regardless of format; and 32) Optionally injects bit errors in any data type.

Pass Through and FEC Overview

Figure 3:
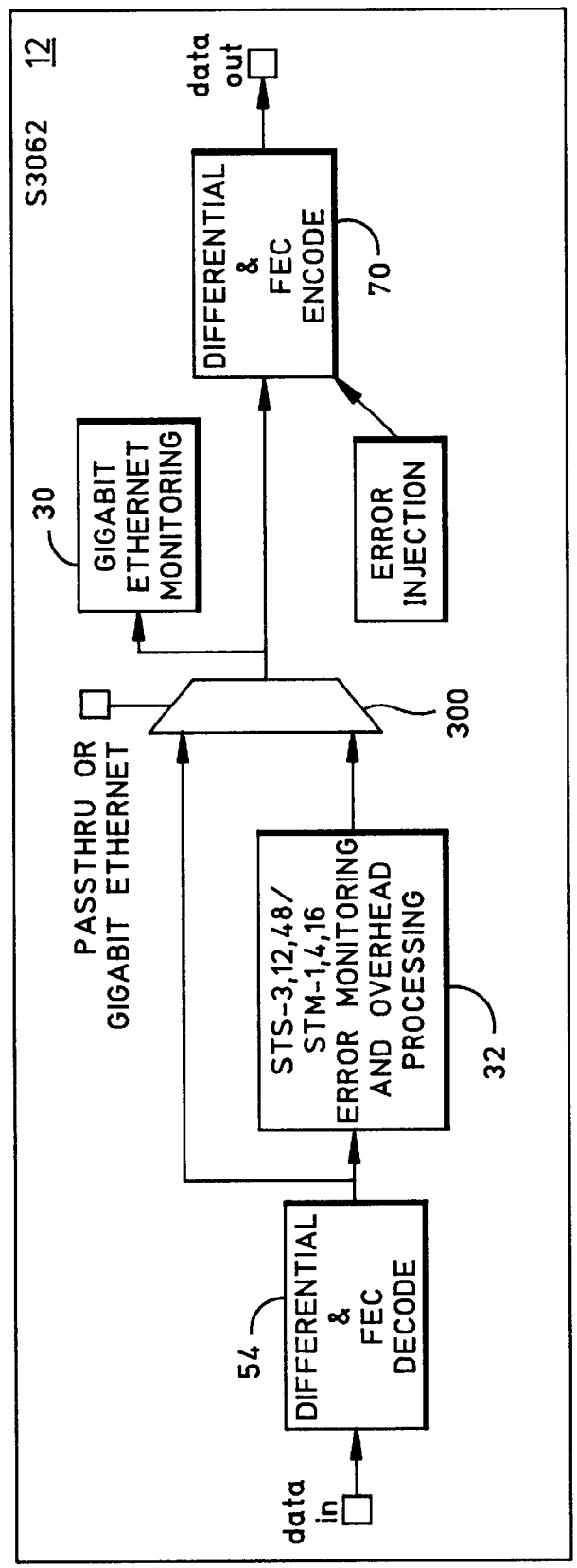
FIG. 3 is a schematic block diagram illustrating the basic blocks of the S3062.

FIG. 3 is a schematic block diagram illustrating the basic blocks of the S3062. The S3062 Performance Monitor 12 optionally performs Forward Error Correction (FEC) on any data format. If the data is in SONET/SDH format, the S3062 implements all required features to check the data stream and allow for the extraction and insertion of the section and line overhead bytes. It also implements Gigabit Ethernet 8B/10B monitoring of the data stream. The data stream may run at any frequency from 155.52 to 2500 Mb/s without FEC, which includes STS-3/STM-1, STS-12/STM-4, STS-48/STM-16 and Gigabit Ethernet rates. All modes use a 16-bit parallel single-ended LVPECL data path. The S3062 implements forward error correction, SONET/SDH section and line overhead monitoring and insertion, and Gigabit Ethernet monitoring.

As shown in FIG. 3, data of any type may be passed through this chip without SONET/SDH or Gigabit Ethernet monitoring. In this pass-through mode of operation the performance monitors are turned OFF to reduce power consumption. The differential and FEC encoder/decoder may also be turned OFF to further reduce the S3062's power consumption.

The FEC function is implemented with a variable-rate Reed Solomon codec based upon the Galois Field ($2^8$) symbols. Code rate and error correcting capability are selectable from rate=238/255, 8 byte errors correctable, to rate=248/255, 3 byte correctable. Error statistics are collected for a variety of conditions including total corrected bit errors, corrected ones, corrected zeros and uncorrectable blocks. The codec implementation encompasses the ITU G.975 recommendation for codec and rate, interleaved to four levels. A programmable frame synchronization byte is inserted for rapid and reliable acquisition of the coding frame boundary.

Gigabit Ethernet Overview

The Gigabit Ethernet circuitry 30 (FIG. 3) monitors the received data stream for: loss of synchronization; 8B/10B code violations; and disparity errors. These errors are flagged and available at the I/O signal pins. Error counts are also accumulated over 1 second periods and are available via the processor interface.

SONET/SDH Overview

In SONET/SDH mode, all received section and line overhead bytes are captured and placed in a memory in SONET monitor 32 (FIG. 3). The memory is accessible from either a processor or an FPGA. The overhead bytes that are defined by the SONET/SDH standards are also monitored for errors and performance monitoring (PM) statistics. The results are accessible from the processor or FPGA interface. In addition to being stored in an accessible memory, received section overhead is managed as follows:

1) A1 and A2 bytes are checked for framing and byte alignment;

2) J0 byte is monitored for section trace messages;

3) B1 byte is monitored for bit interleaved parity errors, which are accumulated over 1 second periods;

4) E1 byte is optionally serialized and output on an I/O pin;

5) D1–3 bytes are optionally serialized and output on an I/O pin; and

6) Data can be descrambled in accordance with SONET/SDH standards. Section errors—LOS, LOF, OOF and B1—are output on I/O pins and are available to the processor and FPGA interfaces.

In addition to being stored in an accessible memory, received line overhead is managed as follows:

1) B2 byte is monitored for bit interleaved parity errors, which are accumulated over 1 second periods;

2) K1 and K2 bytes are monitored for new or inconsistent values. K2 is also monitored for line AIS and RDI;

3) D4–12 bytes are optionally serialized and output on an I/O pin;

4) S1 byte is monitored for inconsistent values and for mismatches with a software programmable value;

5) M1 byte is monitored for REI errors, which are accumulated over 1 second periods; and 6) E2 byte is optionally serialized and output on an I/O pin. Line error indicators—line AIS, line RDI, line REI, B2, signal fail, signal degrade, K1, K2 and S1 changes are only accessible via the processor or FPGA interfaces, they are not output on I/O pins.

All transmitted section and line overhead bytes can be written through the FPGA or processor interface. In addition, data transmission can be modified as follows:

1) Framing bytes can be regenerated with values A1=F6h and A2=28h;

2) J0 byte may be filled with section trace bytes from a memory;

3) B1 and B2 bytes can be recalculated;

4) E1, D1–3, D4–12 and E2 bytes can be sourced, serially from S3062 I/O pins;

5) data can be scrambled in accordance with SONET/SDH standards;

6) line AIS can be activated automatically when LOS or LOF conditions are detected, or the user may force the transmitter to output line AIS; and 7) the entire data stream can be turned off (all zeros output).

The SONET/SDH application is designed to monitor incoming SONET/SDH data streams and optionally modify them. It can also be used as a SONET/SDH generator. The S3062 transmit clock (TXCLKP/N) will generate correct section (regenerator) overhead and line AIS if the receive clock (CLKINP/N) is absent. If the receive clock is present, any data format may be turned into SONET/SDH frame. The frame counter does not need to find byte alignment to begin running.

Figure 4A:
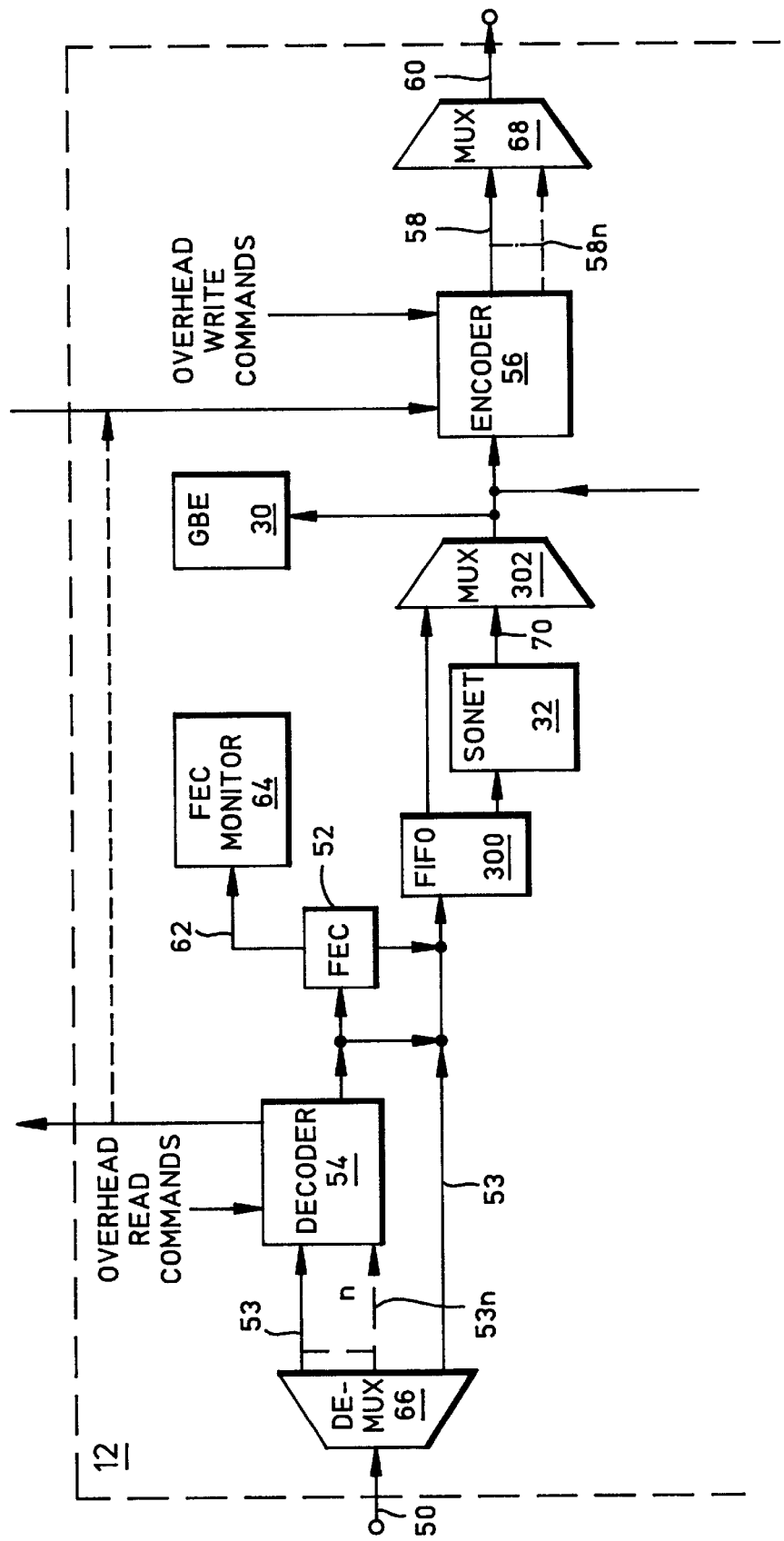

FIGS. 4a and 4b are more detailed schematic block diagrams illustrating the present invention of FIG. 3. Generally, the IC shown in FIG. 4a includes a set of optionally enabled performance monitoring circuitry that may be used in a wide variety of combinations which are selected by the user.

The integrated circuit (IC) performance monitor 12 comprises an input port on line 50 to accept a first stream of information. In some aspects of the invention the first stream of information operates at rates in the range from 100

Megabits per second (Mbs/s) to 2.67 Gigabits/s. A selectably enabled Forward Error Correction (FEC) circuit 52 has an input connected to the input port on line 53 to receive the first stream of information The FEC circuit 52 has a output on line 53 to provide a corrected stream of information, independent of the first stream communications protocol, when the FEC circuit 52 is enabled.

A selectively enabled decoding circuit 54 has an input connected to input port on line 53 to accept the first stream of information. The decoding circuit 54 provides a decoded first information stream at an output on line 53 when the decoding circuit is enabled. The input of the selectively enabled FEC circuit 52 is connected to the output of the selectively engagable decoding circuit 54 to selectively correct the decoded first information stream.

A selectively enabled encoding circuit 56 has an input selectively connected to input port, and to the outputs of the selectively engagable decoder circuit 54, FEC circuit 52, SONET/SDH monitor 32, and to (in parallel) the GBE monitor 30. The encoding circuit 56 provides an encoded information stream at an output on line 58 when the encoding circuit is enabled. When the encoder 56 is not enabled, the information stream passes through the device to line 58 without encoding. An output port online 60 is selectively connected to the input port and to the outputs of the selectively enabled decoder 54, FEC circuit 52, and encoder circuit 56. That is, the information may appear at the output port after passing through from the input port, with no processing. Alternately, the information appears at the output port after combinations of decoding, FEC, and encoding processes.

In some aspects of the invention the FEC circuit 52 has a monitor output on line 62. A selectively enabled FEC performance monitor circuit 64 has an input connected to the monitor port of the selectively enabled FEC circuit 52 on line 62 to evaluate the corrections being made by the FEC circuit 52 when it is engaged. The FEC performance monitor circuit 64 analyzes errors selected from the group of "1"s count, "0"s count, the count of uncorrectable frames, the total of corrected bits, and the total of corrected bytes. A "1"s count is the total number of errors corrected that involve an error where the corrected bit was a "1". Likewise a "0"s count is the total number of errors where the correct bit was a "0". A "1"s and "0"s count can often used in the troubleshooting process to analyze connecting lines and interfaces for voltage imbalances.

A deinterleaver, or deMUX circuit 66 has an input connected to the input port on line 50. The deinterleaver circuit 66 deinterleaves the first stream of information into a plurality of n parallel data streams at a plurality of n outputs. The n parallel data streams are represented by the dotted line between line 53 and line 53n, where n can be any number. That is, line 58 represents n parallel lines.

An interleaver, or MUX circuit 68 has a plurality of n inputs to accept a plurality of n parallel data streams, represented by lines 58 through 58n. The interleaver circuit 68 has an output on line 60 connected to the output port to provide the interleaved plurality of n parallel data streams as a second stream of information.

Likewise, the selectively enabled FEC circuit 52 has a plurality of n inputs and a plurality of n outputs (which are not explicitly shown for simplicity). In fact, decoder circuit 54, FEC circuit 52, SONET/SDH monitor 32, GBE monitor 30, and encoder 56 are all interconnected with sets of n parallel lines in a data bus. As is explained in greater detail below in the discussion of FIG. 7, the FEC circuit 52 organizes the first stream of information into a first frame structure including data sections and parity sections in each of the n data streams, when engaged. The FEC circuit 52 uses information in the parity sections to correct errors detected in the first stream of information.

In some aspects of the invention the deinterleaver circuit 66 deinterleaves the first stream of information into four parallel data streams (n=4). The FEC circuit 52 organizes the four parallel data streams into a first frame structure with a data section including a plurality of p bytes and parity section including a plurality of q bytes, when engaged. Specifically, the FEC circuit 52 organizes of the four parallel data streams into a first frame structure formed from a block of 255 bytes in each data stream, with the plurality of p and q bytes varying to permit FEC of three to eight bytes in each block, when engaged. Again, the FEC capabilities are discussed in greater detail in the explanation of FIG. 7. The FEC circuit 52 processes the first information stream using a Reed Solomon (RS) FEC scheme, when enabled.

A selectively enabled SONET/SDH performance monitoring circuit 32 has an input selectively connectable to the input port, and to the outputs of the selectively enabled FEC circuit 52 and decoder circuit 54. The SONET/SDH performance monitoring circuit 32 provides an analysis of SONET/SDH protocol errors in the information stream at a monitor port, when enabled. The SONET/SDH performance monitoring circuit 32 has an output to provide the analyzed first information stream on line 70.

As is discussed in much greater detail below in the explanation of FIGS. 13–15, the SONET/SDH performance monitoring circuit 32 analyzes the first stream of information for errors selected from the group consisting of trace section message errors, synchronization errors, frame alignment errors, byte alignment errors, B1. and B2 bit errors, bit error rate (BER) calculations, Alarm Indication Signal (AIS) errors, and, Remote Error Indicator (REI) errors.

A selectively enabled Gigabit Ethernet performance monitoring circuit 30 has an input selectively connectable to the input port, and to the outputs of the selectively enabled decoder circuit 54 and the FEC circuit 52. The GBE performance monitoring circuit 30 provides an analysis of GBE and fiber channel protocol errors at a monitor port (not shown), when enabled. As explained in greater detail below in the discussion of FIGS. 11 and 12, the GBE performance monitoring circuit 30 analyzes the first stream of information for errors selected from the group consisting of synchronization errors and invalid code word errors.

Figure 5:
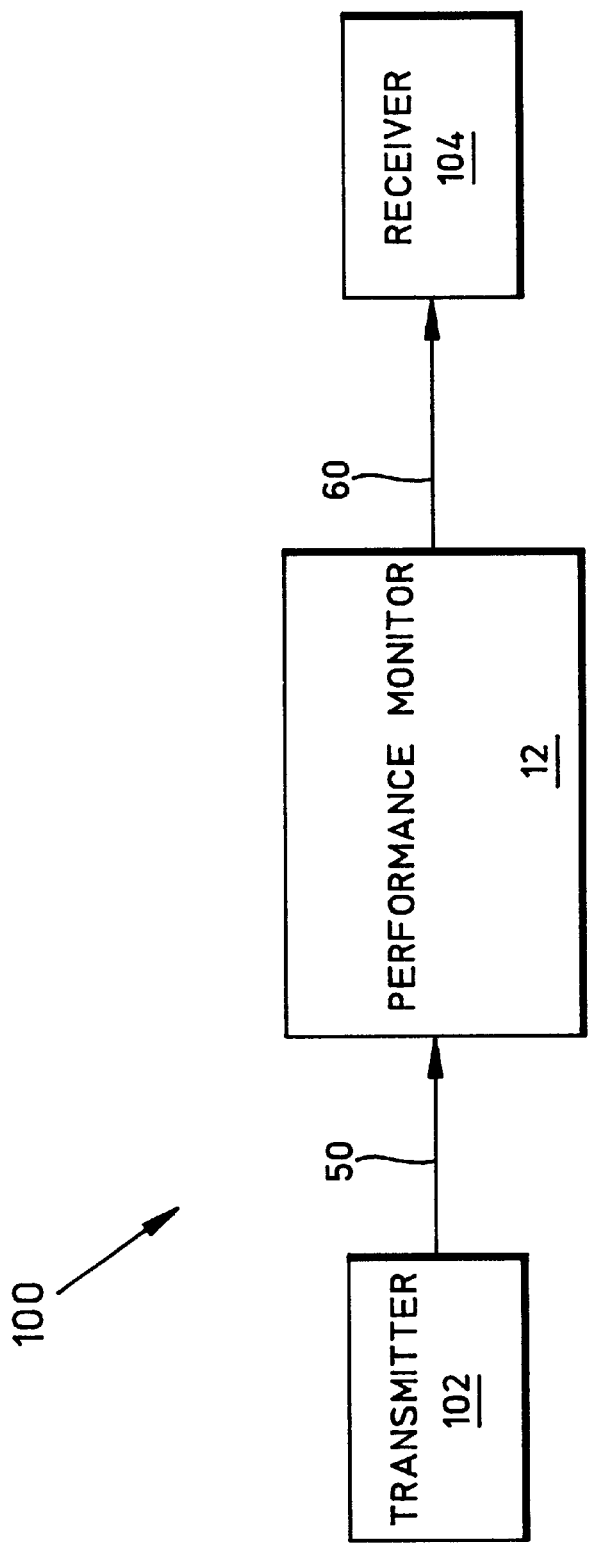
FIG. 5 is a schematic block diagram illustrating the present invention system for monitoring communication performance.

FIG. 5 is a schematic block diagram illustrating the present invention system 100 for monitoring communication performance. A transmitter 102 has an output on line 50 to provide a first stream of information. A performance monitor 12 is included in the system 100 comprising circuits that are described above in the explanation of FIGS. 4*a* and 4*b*. The input port of performance monitor 12 is connected to the transmitter output on line 50 to accept the first stream of information. An output port is operatively connected to the input port to provide a second stream of information on line 60. As explained above, the operative connection between input and output may involve performance monitoring through the decoder 54, FEC circuit 52, SONET/SDH monitor 32, GBE monitor 32, and encoder 56.

A receiver 104 has an input port connected to the output port of the performance monitor 12 on line 60 to accept the second stream of information.

Figure 6:
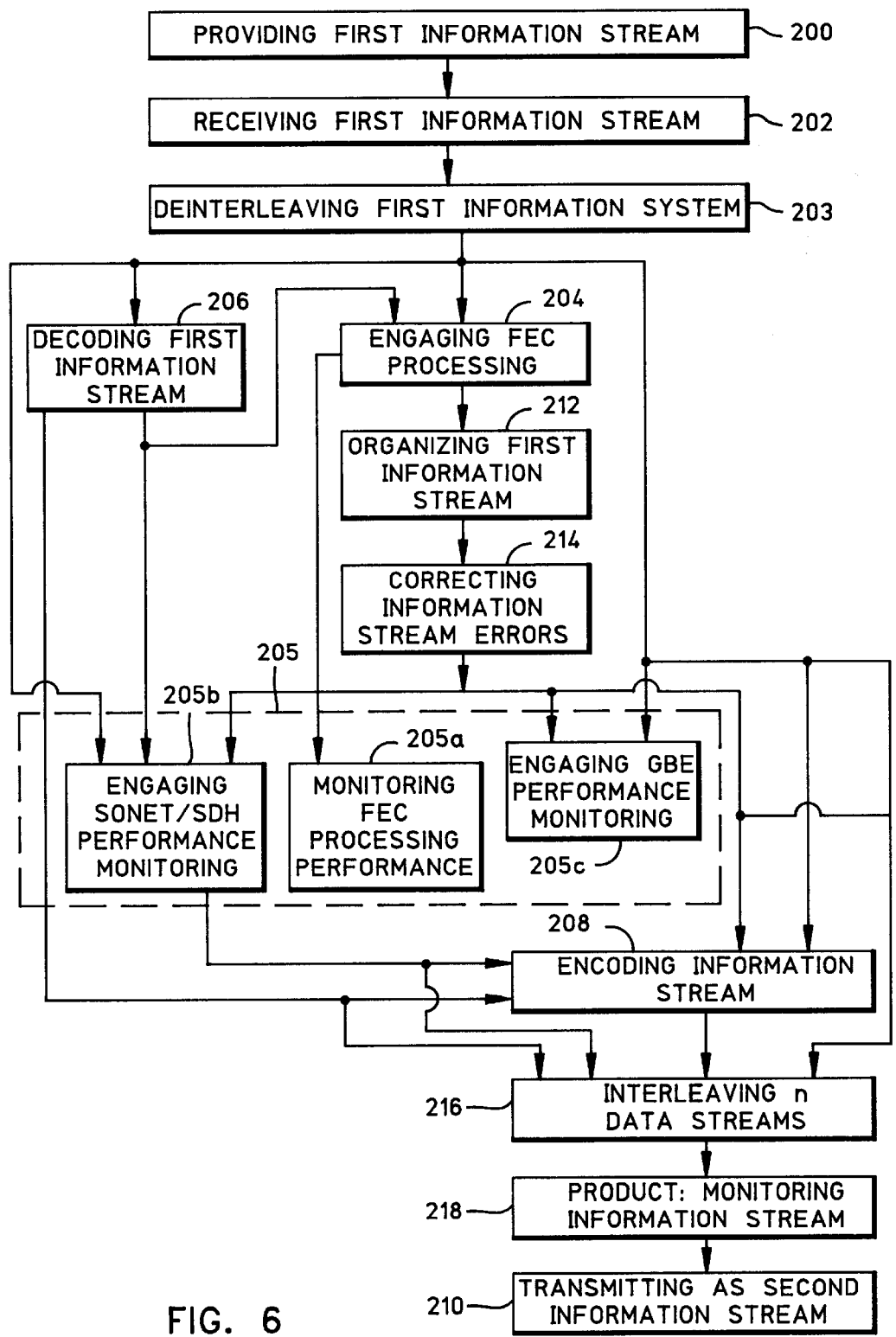
FIG. 6 is a flowchart illustrating the present invention process for monitoring information independent of communication protocols.

FIG. 6 is a flowchart illustrating the present invention process for monitoring information independent of communication protocols. Although the method is presented as a sequence of numbered steps for clarity, no order should be inferred from the numbering unless explicitly stated. The process describes a collection of optional steps which may be performed separately, or in combination with other optional steps. In fact, a key component of the process is the selective linkage occurring between the individual process steps.

Step 200 provides a first information stream in a plurality of communication protocols. Step 202 receives the first stream of information. The reception of the first stream of information in Step 202 includes receiving the first stream at rates in the range from 100 Megabits per second (Mbs/s) to 2.67 Gigabits/s. Step 204 selectively engages a Forward Error Correction (FEC) processing of the first information stream. The selectively engaged FEC process of Step 204 includes using a Reed Solomon (RS) FEC scheme. Step 205, represented as the block of steps enclosed by dotted lines selectively monitors the performance of the first information stream.

Step 206 selectively decodes the first stream of information. In some aspects of the invention the selectively engaged FEC process of Step 204 includes correcting the selectively decoded first information stream. Following the selectively engaged FEC process of Step 204, Step 208 selectively encodes the stream of information. Following the selectively engaged FEC processing of Step 204, Step 210 transmits the stream of information as a second stream of information.

In some aspects of the invention, the FEC processing is engaged in Step 204 to perform FEC processing on the first stream of information. The selective performance monitoring of Step 205 then includes the sub-step, Step 205a, of selectively monitoring the performance of the FEC processing. The selective monitoring of the FEC performance in Step 205a includes monitoring FEC performance independent of the first information stream data rate. The FEC monitoring analyzes errors selected from the group of "1"s count, "0"s count, the count of uncorrectable frames, the total of corrected bits, and the total of corrected bytes.

Step 203 deinterleaves the first stream of information into a plurality of n parallel data streams. In some aspects of the invention, wherein the selective FEC processing is engaged in Step 204 to perform FEC processing on the first stream of information, the method comprises further steps. Step 212 organizes the first stream of information into a first frame structure including data sections and parity sections. Step 214, using information in the parity sections, corrects errors detected in the received first stream of information.

In some aspects of the invention Step 203 deinterleaves the first information stream into four parallel data streams. Then, Step 212 organizes the four parallel data streams into a first frame structure with a data section including a plurality of p bytes and parity section including a plurality of q bytes. The organization of the four parallel data streams into a first frame structure in Step 212 includes forming a block of 255 bytes in each data stream, with the plurality of p and q bytes varying to permit FEC of three to eight bytes in each block. Following the selective FEC processing in Step 204, Step 216 interleaves the plurality of n parallel data streams into the second stream of information.

In some aspects of the invention the reception of the first information stream in Step 202 includes the first information stream being a SONET/SDH protocol communication Following the engagement of the FEC process of Step 204, the selective monitoring of performance in Step 205 includes a sub-step, Step 205b, of selectively engaging the performance monitoring of the SONET/SDH protocol information stream. When the SONET/SDH performance monitoring is engaged, Step 205b monitors the first stream of information for errors selected from the group consisting of trace section message errors, synchronization errors, frame alignment errors, byte alignment errors, B1 and B2 bit errors, bit error rate (BER) calculations, Alarm Indication Signal (AIS) errors, and Remote Error Indicator (REI) errors.

In some aspects of the invention the reception of the first information stream in Step 202 includes the first stream of information being a protocol selected from the group consisting of Gigabit Ethernet (GBE) and fiber channel protocols. Following the selectively engaged FEC process in Step 204, the selective performance monitoring of Step 205 includes a sub-step, Step 205c, of selectively engaging the performance monitoring of the GBE and fiber channel protocol information stream. When the GBE performance monitoring is engaged in Step 205c, the first stream of information is monitored for errors selected from the group consisting of synchronization errors and invalid code word errors.

Step 218 is a product where a stream of information is analyzed in a plurality of optional performance monitoring processes. The first stream of information is optionally processed at the FEC block 204, the decoder block 206, the encoder block 208, the SONET/SDH block 205b, to the GBE block 205c, or passed through to block 216 for interleaving before transmission. The output of decoder block 206 is optionally processes at FEC block 204, the encoder block 208, the SONET/SDH block 205b, to the GBE block 205c, or passed through to block 216 for interleaving before transmission. In the interest of brevity, every process path combination is not listed here. However, the process paths can be seen in the figure, and details of some of the more important process, combinations follow.

Pass-through and FEC

Referring again to FIG. 4a, the received data enters the chip 12 on line 50 and is demultiplexed, or deinterleaved, by deMUX 66, from 16-bits to 32-bits. The data goes to the decoder 54 and FEC block 52. If the received stream of information has been differentially or FEC encoded, it bypasses the decode block 54 and FEC block 52 and travels to the re-synchronizing FIFO 300. The data stream may optionally be differentially encoded and decoded if the data outside the S3062 (12) is inverted an unknown number of times.

From decoder 54, the data may pass from the differential decoder function to the FEC circuit 52. The FEC circuit 52 locates the FEC byte boundaries by aligning to the Frame Synchronization Byte (FSB). The default value for this byte is 3Ch, but it is reprogrammable through the 'FSB' register. A FSB is sent as the first byte of a 255-byte block. The blocks are interleaved such that 4 FSBs will be received one after the other followed by the rest of the four interleaved 255-byte blocks.

Figure 7:
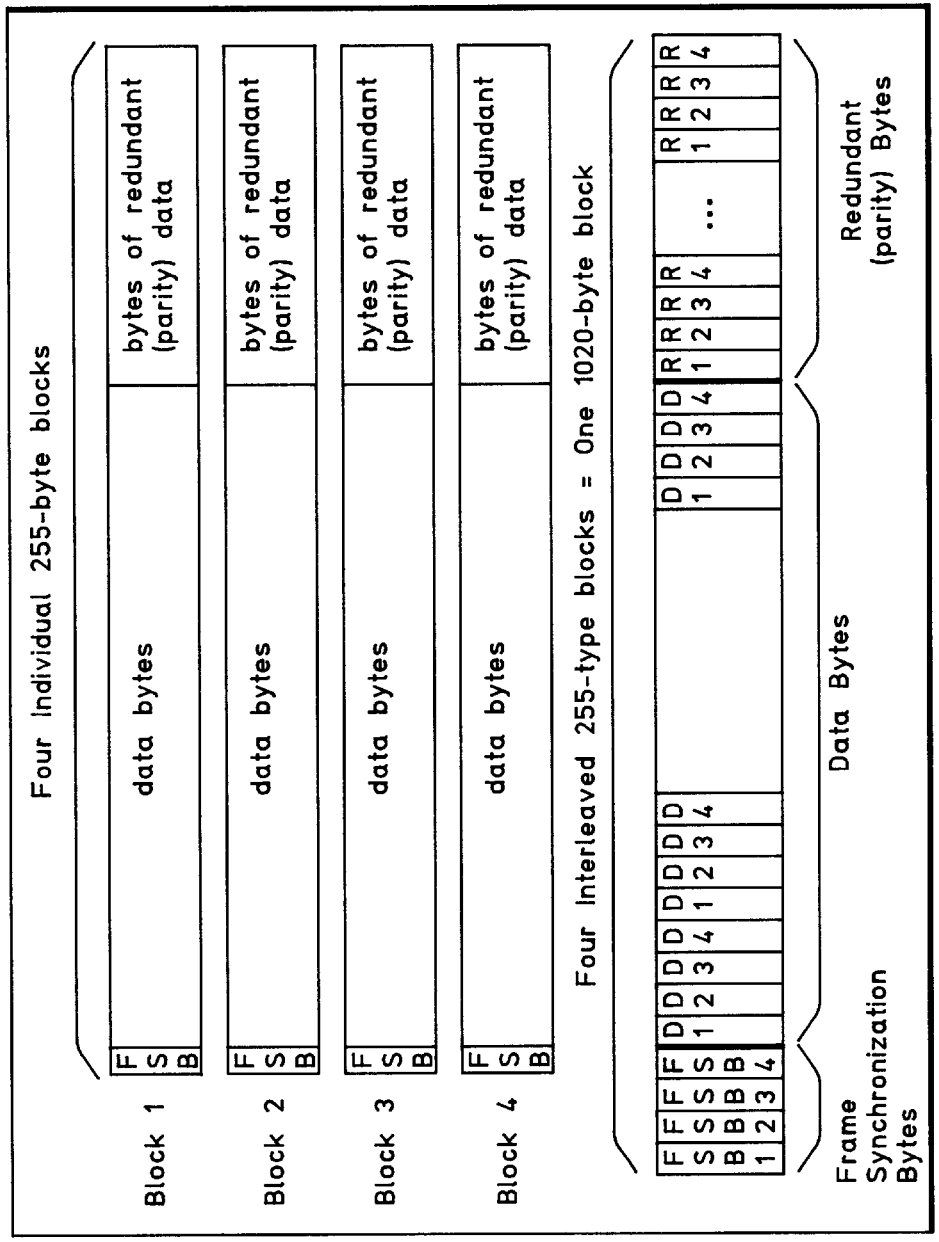
FIG. 7 illustrates the FEC encoded data structure of the present invention.

FIG. 7 illustrates the FEC encoded data structure of the present invention. The decoder 54 synchronizes to the four FSBs, going in-frame after receiving 2 consecutive groups, spaced the correct distance apart (4*255 bytes). By default, all of the bits in the 4-FSB group are checked. If some of the FSB bits are being robbed for a data link, software can program the S3062 to only check the remaining real FSB bits for the framing value.

After frame has been found, the framer keeps looking for the 4-FSB groups at the correct spacing. It goes out of sync after seeing 4 consecutive bad groups. To make the algorithm more robust to bit errors, by default only the 6 most and 6 least significant bits in the 4-byte group are checked once the framer is in-frame. For example, in FIG. 7 the bits checked would be the 6 most significant bits of FSB1 and the 6 least significant bits of FSB4. The default condition can be changed by software.

The defaults, used in the framing algorithm, are selectable as follows:

The number of consecutive error-free groups required to go in-frame, default 2, can be changed to any value from 0–15. If the value 0 is selected, framing will not occur correctly;

The bits within the 4-FSB group to check when out-of-frame can be changed by writing to the 'FEC Out-of-Frame FSB Check Enable' register. The default register value is FFFF FFFFh, check all bits. If too few bits are selected, framing will not occur correctly;

The number of consecutive erred groups required to go out-of-frame, default 4, can be changed to any value from 0–15. If the value 0 is selected, framing will not occur correctly.

Figure 8:
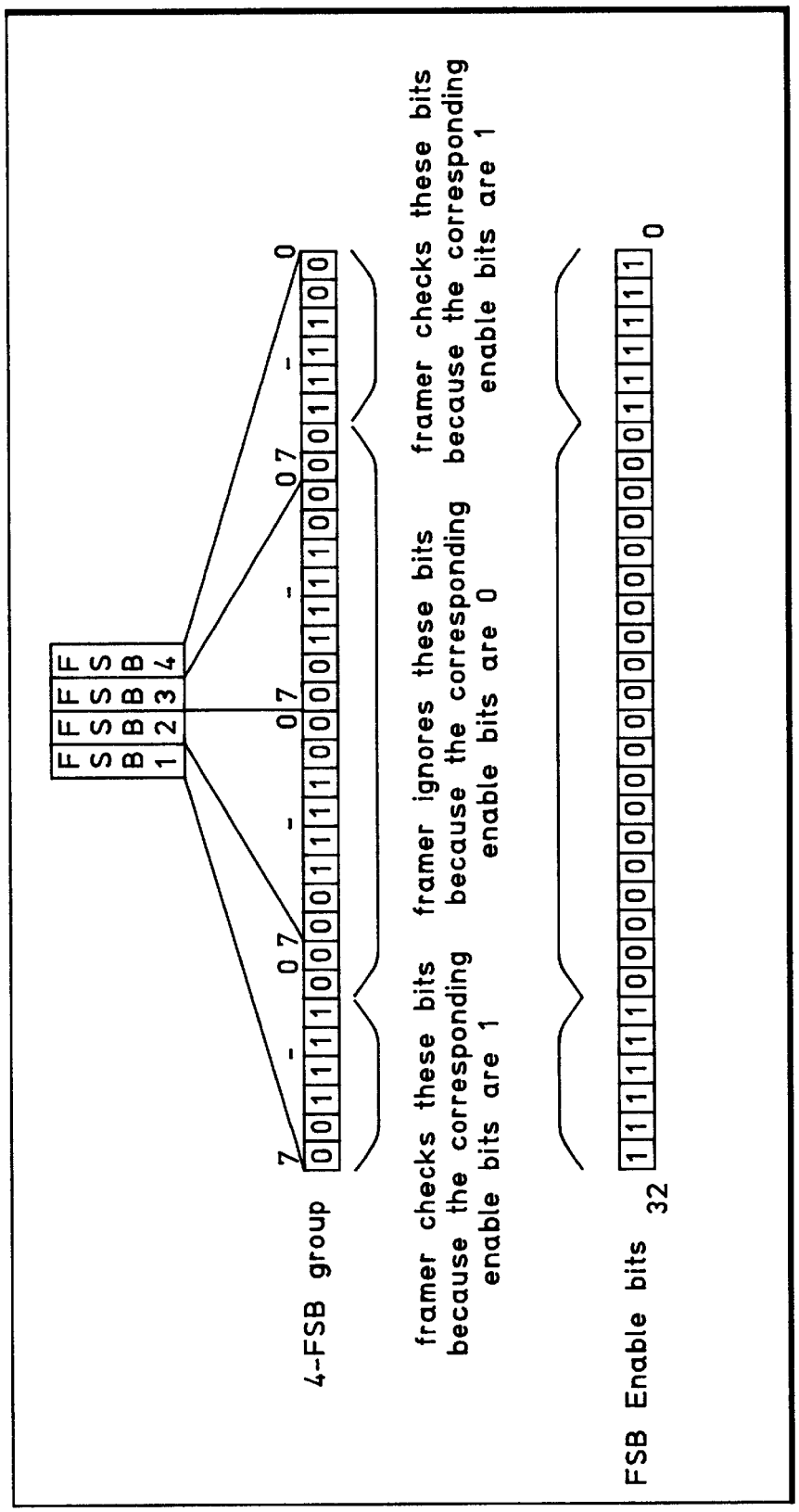
FIG. 8 illustrates the frame check enabling.

FIG. 8 illustrates the frame check enabling. Which bits within the 4-FSB group to check when in-frame can be changed by writing to the 'FEC In-Frame FSB Check Enable' register. The default register value is fc00 003fh, checks 12 bits. If too few bits are selected, framing will not occur correctly. If too many bits are selected, the framer will be more likely to go out-of-frame when the bit error rate is high. The frame check enable registers work as follows: each bit in the 32-bit register represents a bit in the 4-FSB group. If the enable for a particular bit is on (1), the bit will be checked.

Figure 9:
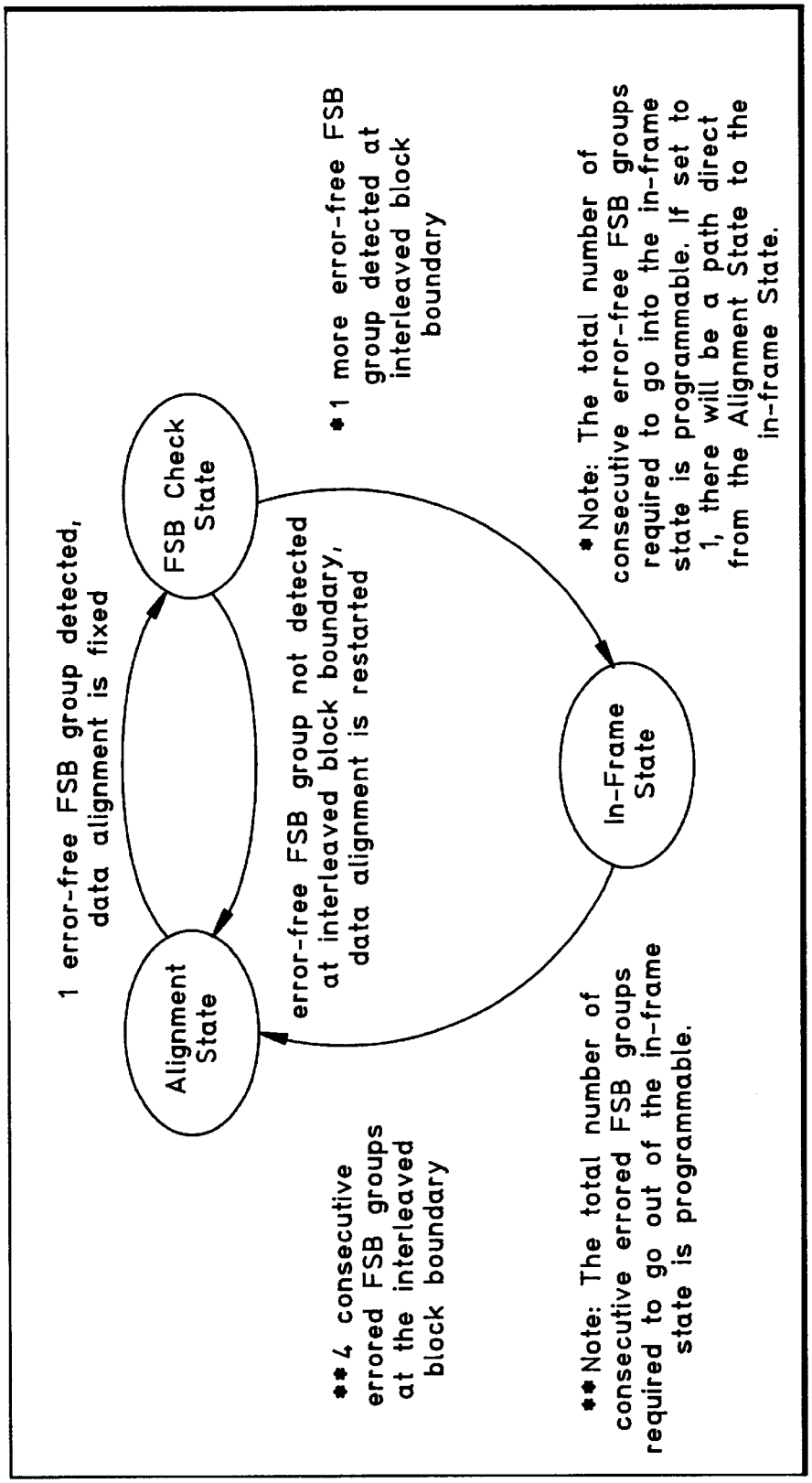
FIG. 9 depicts the FEC framing state machine.

FIG. 9 depicts the FEC framing state machine. Once the data is aligned, it is checked with the S3062 Reed Solomon (RS) decoder. Reed Solomon encoding consists of generating parity bytes that are an algebraic function of the user data. There are 2*T parity bytes added to the payload data, where "T" is the number of correctable bytes in the block. The decoder computes 2*T syndromes of the received FEC block, including the FSB, and computes an error locator polynomial as well as a magnitude polynomial from the 2*T syndromes. These latter two polynomials provide the information necessary to detect and correct the erred bytes (up to T bytes per FEC block).

If the decoder detects a correctable error, it does so whether the error is in the FSB, the data or the parity bytes themselves. It also keeps statistics on the number of errors and the error type. There is a count for the number of "1"s corrected, the number of "0"s corrected and the total number of bits and the number of bytes corrected. Since up to 8 errors can be corrected per byte, the number of bytes corrected can be as much as 8 times less than the number of bits corrected.

There is also a count for uncorrectable frames, those that have more than T errors in them. In those frames, the bits and bytes, which are corrected, are still counted and the uncorrectable frame count is incremented. It is not possible to guarantee that the circuit will be able to find all of the uncorrectable frames. If the frame has been corrupted in such a way that it still looks like a valid frame, it will be treated as such. Therefore, if uncorrectable frames are seen, there is a reasonable chance that there were more uncorrectable frames than those which were counted. Furthermore, the corrected bit and byte counts become suspect since some of the bits and bytes "corrected" may have been corrupted instead All of the error counts run continuously, regardless of whether the FEC decoder is in or out-of-frame. Software ignores the counts when the decoder is out-of-frame and ignore the first count read when the decoder goes in-frame. The counts accumulate for a period delineated by the 1-second tick. Upon receiving each tick, the count is transferred to a software-readable register and the count is cleared.

The FEC framer can be programmed to ignore certain bits in the 4-byte FSB group when those bits are used for a data link. The data link bits, used for the received data link, are defined by the 'FEC Out-of-Frame FSB Check Enable/Data Link Bit Selection' register. If the 'RX FEC Data Link ON' register pin (signal) is enabled, the appropriate bits are copied from the FSB group and shifted serially out, LSB first, of the 'FEC Receive Data Link Out' pin (RX_FEC_DL) along with a clock (RX_FEC_DLCK). The clock only runs when there is data to be output; it is a gapped clock with a frequency of CLKINP/N divided by 12. Since the S3062 may accept input clocks from 155.52 MHz/16 to 2678.57 MHz/16, the serial clock output can vary from 810 kHz to 13.95 MHz.

In the reverse direction, if the 'TX FEC Data Link ON' bit is enabled, a serial clock is provided on the TX_FEC_DLCK pin, which is the TXCLKP/N divided by 12, and data is brought in from the 'FEC Transmit Data Link' (TX FEC_DL) I/O pin. The data is inserted into the 4-byte outgoing FSB group in the locations specified by the 'FEC Encode FSB/Data Link Bit Selection' register.

If data link bits (second and fourth OH group) have been defined in both the decode and encode FSBs, but the data link add has not been enabled, the data in the link will be passed through For this to work correctly, the data rate entering the link must be the same as the data rate going out. Therefore, both the FEC decode and FEC encode must be enabled with the same number of bits and error correction rate for the data link to be identical in both receive and transmit, FSBs. Note that the number of bits in the FSBs must be the same, not the actual locations of the bits. Table 1 shows a summary of how the data link works given that the appropriate FSB bits have been enabled.

TABLE 1

Data Link Enable

| RX FEC Data Link ON | TX FEC Data Link ON | Data Link Description |
|---|---|---|
| 0 | 0 | Pass-through: data link bits in RX FSBs are copied to the bits in the TX FSBs |
| 0 | 1 | Insert Only: data link information is taken from the TX_FEC_DL pin and inserted in the TX FSBs |
| 1 | 0 | Drop and Continue: data from the RX FSBs goes out on RX_FEC_DL and is copied into the TX FSBs |
| 1 | 1 | Drop and Insert: data from the RX FSBs goes out on RX_FEC_DL. Data from TX_FEC_DL is inserted into the TX FSBs |

A user may define anywhere from 0 to 32 of the FSB bits to be used for the data link. The more bits used for the data link, the fewer there will be available for the FSB framer. If all bits are used for the data link, the framing will not work. To determine the data link rate obtained from the chosen data link bits, the following equation may be used:

LINK RATE=(number of bits chosen for the link/(4*255 bytes*8 bits/byte))*data rate in bits/sec.

For example, consider a 1.25 GHz Gigabit Ethernet link encoded with FEC providing 8 bytes/255 bytes error correction capability. FEC encoding increases the data rate as shown in the FEC Algorithm. In this example, the data rate is 1.25 GHz*255/238=1.34 GHz. If 8 bits are stolen from the FSB for the data link, the data link bit rate is 8/(4*255*8) *1.34 Gb/s=1.3 Mb/s.

Returning to FIG. 4a, regardless of whether or not the data goes through the decoder 54, it must run through the FIFO 300 to become aligned with the transmit clock. The transmit clock may be identical to the receive clock or it may have a different phase or different frequency. The FIFO 300 is simply a 256×32 bit circular memory with the write address running on the receive clock (divided down CLKINP/N) and the read address running on the transmit clock (divided down TXCLKP/N). When the S3062 is reset the addresses also reset; offset by 180 degrees.

The FIFO is used as follows:

1) If FEC is not enabled, the transmit clock is the same frequency as the receive clock and the FIFO handles the possible phase difference between the two clocks;

2) If data coming into the S3062 is FEC encoded, but the data going out is not, the frequency of the receive clock is higher than the transmit clock because of the extra frame synchronization and parity bytes. Those extra bytes are not sent through the FIFO. The FIFO acts like an elastic store, passing data bytes, but not the FSB or parity bytes. This shows how the frequency difference is handled internally by the FIFO;

3) If data entering into the S3062 is not FEC encoded, but the data going out is, the frequency of the transmit clock is higher than that of the receive. The extra FSB and parity bytes, however, are not added to the data stream until after the FEC encode block. Prior to that block, there are fewer data bytes than clock ticks so that an internal signal is used to stop the data flow when the FSB and parity bytes are being sent out. The FIFO again acts like an elastic store, receiving data bytes with the slower receive clock and only sending them out with the faster transmit clock when not halted. Thus it handles the frequency difference;

4) If data entering into and leaving the S3062 is FEC encoded, the receive side stores data bytes into the FIFO as mentioned in point (2) and the transmit side only takes data out when it is not halted by the internal stop signal, as mentioned in point (3). The FIFO again works as an elastic store.

Since the transmit clock is derived from the receive clock externally to the S3062, the FIFO's read and write addresses will not normally overtake each other. However, if the addresses do come within 2 to 6 addresses of each other, the S3062 will force them back apart and indicate the re-centering with an interrupt. At reset, the addresses start 180 degrees apart. If the FEC decoder is OFF, data starts passing through the FIFO immediately. If the decoder is ON, no data goes through until the FEC framer is synchronized and one frame has been decoded.

Note that if the transmit clock has the capability of free running when the receive clock has failed, all but the FEC and differential decoding portions of the chip will continue to function. This will permit a signal (in the case of SONET/ SDH, a valid line AIS, signal) to be sent out so that downstream devices will not also lose clock.

When the transmit clock is generated from the receive clock through an external PLL circuit, it may drift from the receive clock's frequency until the PLL has locked. While the clocks are drifting, the FIFO pointers will move closer to each other. When the PLL circuit has finally locked, the pointer positions relative to each other are unknown and should be pushed 180 degrees apart to prevent unexpected collisions due to clock drift or another unexpected event. If the FEC_ENC pin is enabled, software may force the FIFO to re-center by changing the FEC capability in the 'FEC Encode General Controls' register. A valid but incorrect value in these registers will cause the S3062 to remove more, or fewer, bytes than it should within the FIFO, forcing the read and write pointers to collide. The collision will trigger an interrupt indicating that the FIFO has re-centered. Software may then service the interrupt and change the 'FEC Capability' bits to their normal values before the pointers move significantly from their initialized positions, 180 degrees apart.

For example, if the FEC capability is set to 8-byte correction, each 255-byte block has 238 bytes of data, 1 FSB byte and 16 redundant bytes. If the capability is set to 7-byte correction, each 255-byte block has 240 bytes of data, 1 FSB byte and 14 redundant bytes. Therefore, if the chip is supposed to be generating 8-byte correction and the user changes it to 7-byte correction, 2 (240–238) extra data bytes will be removed from the FIFO each time a 255-byte block passes through the FIFO. The read pointer will move 2 locations closer to the write pointer per 255-byte block. If the read pointer starts 180 degrees (256 locations) away from the write pointer, they will collide within 128 (256/2) 255-byte blocks. When a collision occurs, the hardware forces the pointers 180 degrees apart again.

If the byte correction is changed by 1, the pointers will move apart 2 locations every 255 bytes (as described in the example above). This is the slowest the pointers will move. If the byte correction is changed by 8, (i.e. from FEC encode ON, 8 byte correction to FEC encode OFF), the pointers will move apart 17 locations every 255 bytes. 255 bytes of data will be removed from the FIFO every block instead of 238. 255−238=17. This is the fastest the pointers will move. The time required to output 255-bytes is 255*2*TXCLK= 510*TXCLK.

Returning to FIGS. 4a and 4b, after the FIFO 300 the data may be selected by a pass-through MUX 302 to pass data to the encode block 56, which includes both FEC and differential encode functions. Like the FEC decoder 52, the FEC encode function can be turned ON or OFF from a signal pin (FEC_LENC). Once the pin has been tied high, software, if present,.can disable the feature through the FEC Encode OFF register bit to permit encoding to be turned OFF and ON during tests. The encoder 56 inserts the FSB at the front of each block of bytes and then generates the parity bytes required for error correction over the FSB and data bytes. Note that both the error correction capabilities of the encoded link and the FSB value sent by the encoder 56 can be different than that expected by a subsequent decoder. By default, however, they are the same.

If the data link bits have been selected in the 'FEC Encode FSB/Data Link Bit Selection' register, the encoder brings data into the link from the 'FEC Transmit Data Link' (TX_FEC_DL) I/O pin or it is passed through from the received data link. The choice of which data is transmitted is determined from the 'TX FEC Data Link ON' register bit but both decode and encode data links must be defined for the data to be passed through. For this to work correctly, the data rate entering the link must be the same as the data rate going out. Therefore, both the FEC decode and FEC encode must be enabled with the same error correction rate and the number of bits defined for the data link must be identical in both receive and transmit FSBs. Note that the number of bits in the FSBs must be the same, not the actual locations of the bits. Table 1, above, shows a summary of how the data link works given that the appropriate FSB bits have been enabled.

Errors are injected into the data, the optional selection includes:
- which stream(s) to corrupt out of the 4 interleaved streams;
- whether to corrupt the FSB or the data bytes; and
- which bits in a byte should be corrupted. If data bytes are to be corrupted, the user may also select the number of bytes in each 255-byte block to be corrupted (up to 15).

Without the FEC turned ON, the notion of streams does not exist, but the data is still arranged inside the chip as a 4-byte wide path. For example, if the user specifies 4-bytes of corruption on stream #4, the least significant byte of the internal data path will be corrupted for the first four words every 255-bytes. At the output of the S3062, after the streams have been interleaved, the errors will show up every 1020-bytes in byte numbers 4, 8, 12 and 16

After leaving the encoder 56 the data is multiplexed back up to 16 bits and exits the chip. All the SONET/SDH 32 and Gigabit Ethernet 30 monitoring circuits are powered down if the S3062 is in pass-through mode; thus, less power is consumed than in other modes. The FEC block 52 is also powered down if it is not enabled.

The S3062 algorithm is based upon the (n,k) Reed Solomon Code where n is the block length of the code and k is the number of user symbols per block. The code is defined over the Galois field ($2^8$) resulting in symbols of eight bits, i.e. a byte. It belongs to the family of systematic linear cyclic block codes based on the generator polynomial given by:

$$G(x) = {}_{i=0}\Pi^{2T-1} (x - \alpha^i)$$

where T=(error correcting capability of the RS-Code) and $\alpha^0$=01 hex and $\alpha^1$=02 hex, over the primitive polynomial P(x)=x8+x4+x3+x2+1 on GF($2^8$)

Where $\alpha$ is a root of the primitive polynomial $x_8+x_4+x_3+x_2+1$. A data byte ($d_7, d_6 \ldots d_0$) is identified with the element $d_7*\alpha^7+d_6*\alpha^6+ \ldots +d_0$ in GF(256), the finite field with 256 elements. The "rate" of the code is defined as the ratio of the total symbols in a block to the user data symbols. Since, in this case, symbols are bytes, the code rate is the total number of bytes in a block divided by the number of the user's data bytes in the block. The S3062 supports six different code rates, all based on the same generator polynomial.

TABLE 2

RS Code Rate Expansion

| Reed-Solomon Code | Error Correcting Capability | Code Rate Showing Bandwidth Expansion due to Code Words & FSB | Example of Increased Input Clock Frequency for STS-48/STM-16 (MHz) |
| --- | --- | --- | --- |
| (255,23) | 8 bytes per 255-byte block | 255/238 = 7.14% increase | 155.52*255/238 = 155.52 * 15/14 = 166.63 |
| (255,24) | 7 bytes per 255-byte block | 255/240 = 6.25% increase | 155.52*255/240 = 155.52 * 17/16 = 165.24 |
| (255,24) | 6 bytes per 255-byte block | 255/242 = 5.37% increase | 155.52*255/242 = 163.87 |
| (255,24) | 5 bytes per 255-byte block | 255/244 = 4.51% increase | 155.52*255/244 = 162.53 |
| (255,24) | 4 bytes per 255-byte block | 255/246 = 3.66% increase | 155.52*255/246 = 155.52 * 85/82 = 161.21 |
| (255,24) | 3 bytes per 255-byte block | 255/248 = 2.82% increase | 155.52*255/248 = 159.91 |

The S3062 internally divides the data down into four steams (n=4) to reduce the internal clock speed. Each stream has a dedicated RS codec that may correct up to 8 erred bytes. Since the four codecs are running in parallel, a burst of 32 erred bytes may be corrected. Thus, the error correcting capability of the S3062 is four times better than what might be expected by looking at the simple error correction capability of the RS algorithm. In the S3062, the RS(255, 239) code provides a burst error correcting capability of 32 bytes (4×8-bytes) or 256 bits.

The default code used by the S3062 is the RS(255,239). This algorithm puts 1 FSB, 238 data bytes and 16 parity bytes into a block. See FIG. 6 for the block format. As shown in Table 2 above, this version of the algorithm can correct up to 8 erred bytes in the 255-byte block. The choice of other code rates allows the user to optimize overall system performance by balancing error-correcting capability against the channel degradation due to rate expansion. The default error correcting code may only be changed by programming the 'FEC Capability' register bits.

Figure 10:
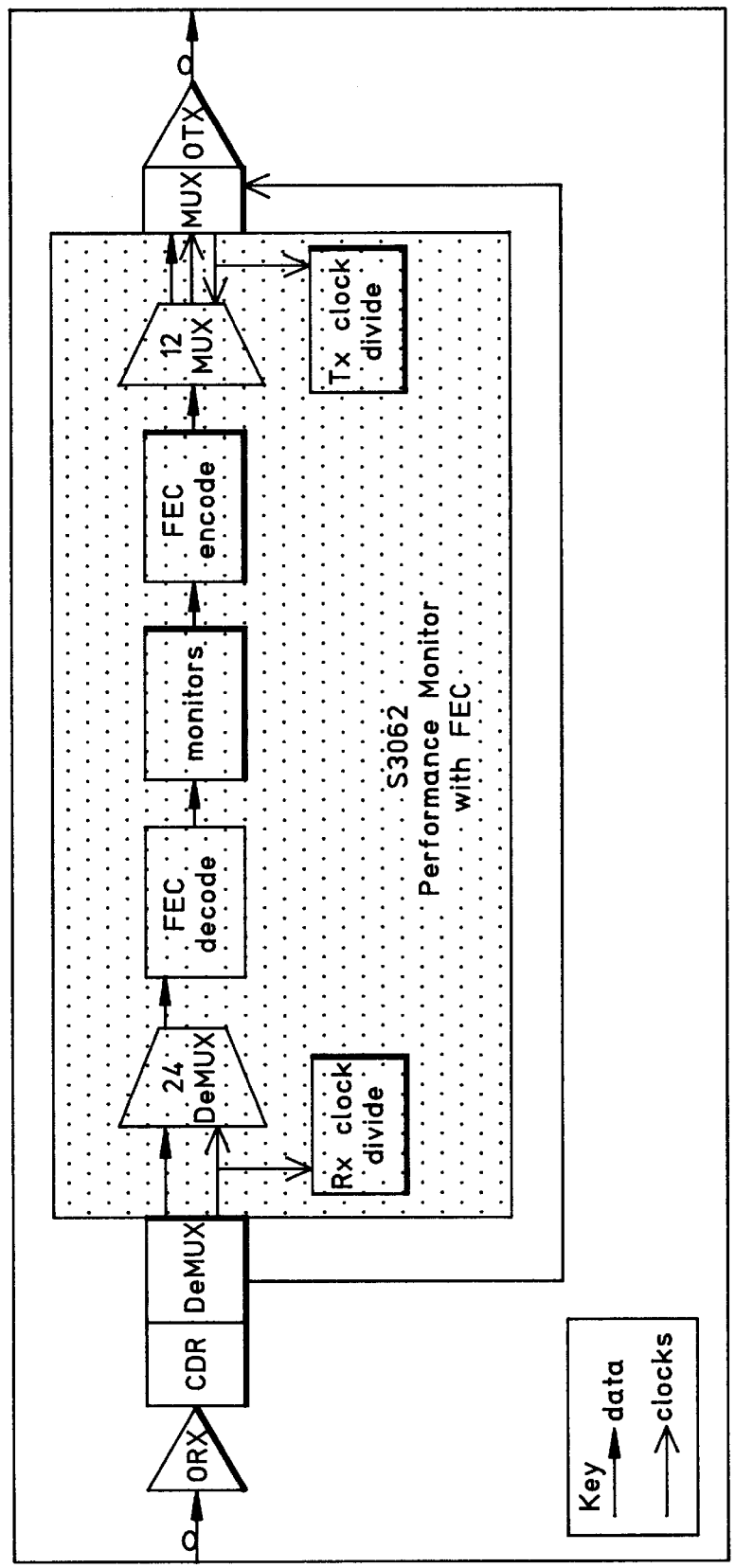
FIG. 10 is a schematic block diagram illustrating the clocking associated with FEC.

FIG. 10 is a schematic block diagram illustrating the clocking associated with FEC. When FEC is bypassed or when full FEC (both decoding and encoding) is enabled, the input clock rate to the device is equal to the output clock rate and no external clock circuitry is required. When the S3062 is used for encoding only, or for decoding only, the input clock rate and output clock differ in proportion to the rate expansion factor listed in bold face in Table 3.

TABLE 3

RX/TX Clock Divider Default Values

| FEC_DEC | FEC_ENC | RX Clock Divider | TX Clock Divider | Description |
| --- | --- | --- | --- | --- |
| 0 | 0 | 4 | 4 | Neither encode nor decode: data stream without FEC |
| 0 | 1 | 14 | 15 | Encode only: start of system-wide FEC data stream |
| 1 | 0 | 15 | 14 | Decode only: end of system-wide FEC data stream |
| 1 | 1 | 4 | 4 | Encode Decode: middle of system-wide FEC data stream |

Normally the clock dividers should be programmed to be either 255/248, 85/82, 255/244, 255/242, 17/16 or 15/14 to match the error corrections of 3, 4, 5, 6, 7 or 8 respectively. If the clock to the transmit section is different from the one derived from the receive clock, the dividers may be programmed with different values in the range of 1 to 255.

Gigabit Ethernet (GBE)

8B/10B Coding is transmission coding scheme used for the Gigabit Ethernet. Each 8-bit data byte is represented by two distinct 10-bit words. For example:

000 11000→110011 0100 or 001100 1011

512 code words represent 256 bytes, and 12 special function code words also exist. Several 8-bit codes are only mapped to one 10-bit word and not all 10-bit words are complete complements of each other.

TABLE 4a

8B/10B Sample Data Codes

| Name | Byte Value | 8 Bits | Code Word (RD−) | Code Word (RD+) | Bal/ Unbal |
|---|---|---|---|---|---|
| /D24.0 | 18h | 00011000 | 110011 0100 | 001100 1011 | Balanced |
| /D25.0 | 19h | 00011001 | 011001 1011 | 100110 0100 | Unbalanced |
| /D26.0 | 1Ah | 00011010 | 101001 1011 | 010110 0100 | Unbalanced |
| /D27.0 | 1Bh | 00011011 | 110110 0100 | 001001 1011 | Balanced |
| /D28.0 | 1Ch | 00011100 | 110001 1011 | 001110 0100 | Unbalanced |
| /D29.0 | 1Dh | 00011101 | 101110 0100 | 010001 1011 | Balanced |
| /D30.0 | 1Eh | 00011110 | 011110 0100 | 100001 1011 | Balanced |
| /D31.0 | 1Fh | 00011111 | 101011 0100 | 010100 1011 | Balanced |

The Purpose of 8B/10B Coding is to maintain DC balance, ensuring that a data stream can be AC coupled without distortion, and to avoid short-term DC offsets by minimizing run length. Invalid code words and code word sequences that break parity rules are possible error types. There are three basic rules that are used in transmitting 8B/10B data:

A data word NEVER contains more than 4 consecutive ones or zeros, this reduces the "Run Length" on the line;

A word containing 4 zeros may only be followed by a word with 5 or 6 zeros; and

A word containing 6 zeros may only be followed by a word with 5 or 4 zeros. Minimizing the "Run Length" avoids any short term DC offsets.

Parity tracks the number of ones and zeros on a line in an attempt to keep their numbers equal +/−1 bit. The "Ideal" pattern is "1 0 1 0". For example:

10101010101010101010101010101.01010

Number of 1s=Number of 0s

An equal number of ones and zeros over an entire line ensures the data stream may be AC-coupled onto a medium without distortion.

A balanced code word has an equal number of ones and zeros. For example:

/D24.0 0011001011 5 zeros and 5 ones inverse 1100110100 still has 5 zeros and 5 ones.

An unbalanced code word has an unequal number of ones and zeros. For example:

/D25.0 1001100100 6 zeros and 4 ones inverse 0110011011 4 zeros and 6 ones.

The choice of which code word to use depends on the running disparity. Single-bit indications of which way the ± bit parity imbalance is leaning, are updated on a code-word by code-word basis.

Positive Running Disparity (RD+)→More 1s than 0s being transmitted

Negative Running Disparity (RD−)→More 0s than is being transmitted.

Running disparity is used in 8B/10B encoding to determine which of the two possible 10-bit codes to send for each 8-bit word. Running Disparity is calculated on the basis of sub-blocks—a six-bit, and then a four-bit, sub-blocks that make up the complete 10 bit word. Running Disparity is "+" if the sub-block contains more ones than zeros or if the six-bit sub-block is 000111, or the four bit sub-block is 0011. Running Disparity is "−" if the sub-block contains more zeros than ones or if the six-bit sub-block is 111000, or the four-bit sub-block is 1100. If the Positive and Negative sub-block criteria has not been met, the running disparity will remain unchanged at the end of the sub-block.

Sequence of 8-bit words to be sent:
00111111 11110111 11111100
D31.1 23.7 D28.7

The encoder begins with RD− and selects appropriate 10-bit code word for D31.0:
Select from RD− column.
Then, the encoder examines previously sent word to determine code word for D23.7:
Examine "101011 1001"=>Select from RD+ column
Then, the encoder examines previous sent word to determine code word for D28.7:
Examine "000101 1110"=>Select from same (RD+) column.
Transmitted sequence:
$RD-$ 101011 1001 $^{RD+}$ 000101 1110 $^{RD+}$ 001110 0001 $^{RD+}$ The following is an example of f 8B/10B Coding Example Using RD.
8 Bit Data Sequence:
00111111 11110111 11111100
Unequal number of 1s and 0s (19 Ones, 5 Zeros)
Long runs of 1s and 0s possible
Transmitted 10-bit Encoded Sequence:
$RD-$ 101011 1001 $^{RD+}$ 00001 1110 $^{RD+}$ 001110 0001 $^{RD+}$
Balanced Line (15 Ones, 15 Zeros)
Maximum run length of 4 consecutive 1s or 0s.

With respect to word alignment, Data is searched for a 10-bit "special" K28.5 word or a Comma. The choice of which K28.5 (or Comma) to search for is dependent upon the current running disparity (RD).

K28.5 word 110000 0101 or 001111 1010
Comma ($1^{st}$ 7 bits of K28.5) 1100000 or 0011111.

Once the first K28.5 word is found, the data going into the Monitor Block is aligned on that word. Aligned words are sent to Monitor Block in sets of 3 or 4. If four words are sent, a "fourth word enable" is sent to the Monitor Block. Error monitors run continuously, regardless of alignment.

Referring again to FIGS. 4a and 4b, in the GBE mode the data flows through the chip 12 as if it were in pass-through mode, but it is also routed to the Gigabit Ethernet monitor 30 from the 32-bit internal bus.

Figure 11:
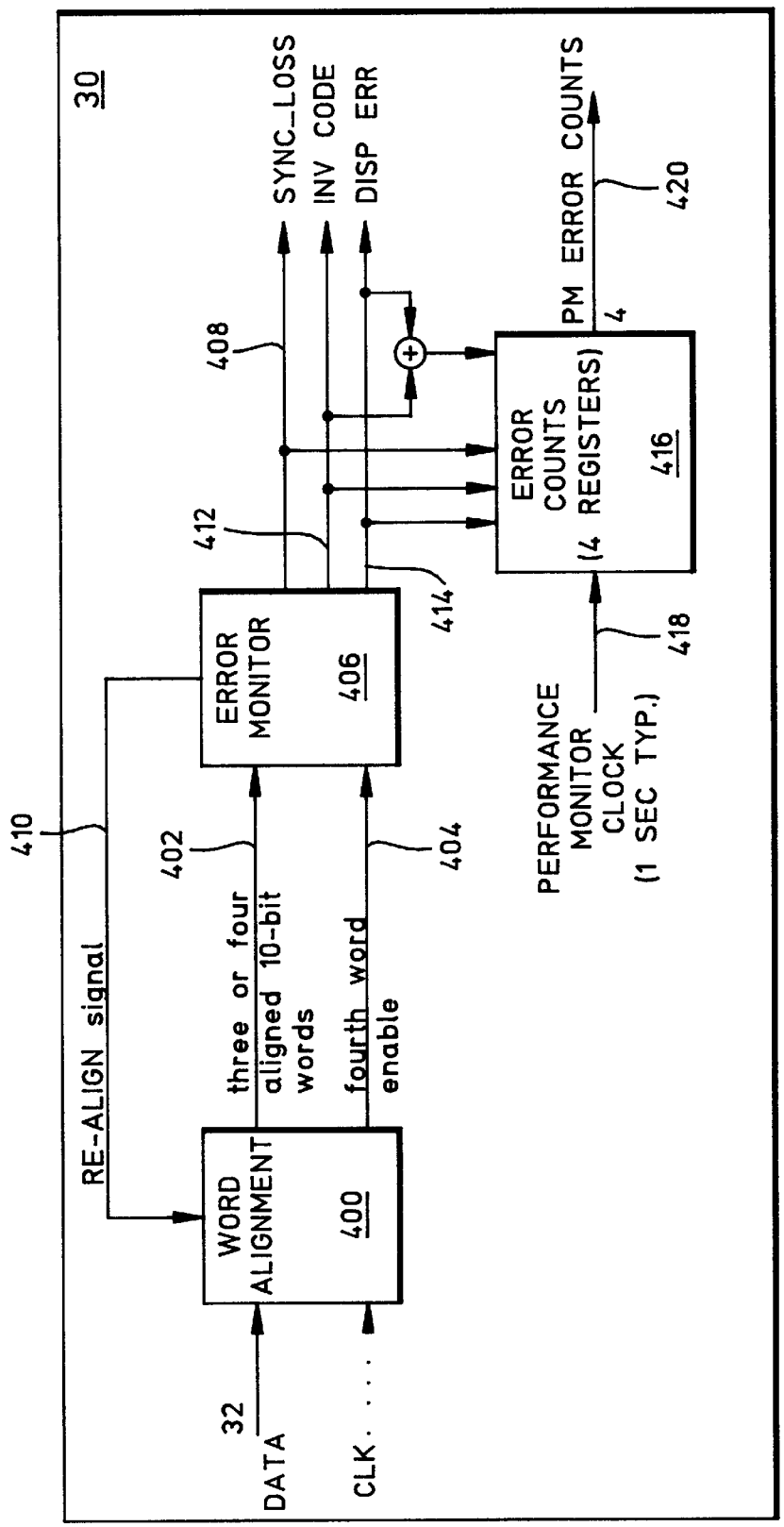
FIG. 11 is a schematic block diagram illustrating details of the GBE monitor.

FIG. 11 is a schematic block diagram illustrating details of he GBE monitor 30. To find the 10-bit Gigabit Ethernet words, the alignment block 400 searches the 32-bit data either for the 10-bit K28.5 word (which is actually one of two words, depending on the running disparity) or for a comma. The K28.5 alignment value is the default for the S3062 but may be changed to a comma by enabling the IEEE synchronization method, with the 'IEEE ON' register bit. The error monitors run continuously (except when reset is asserted) and are not dependent on the alignment block 400. Note that the data entering the GBE block 30 is in 32-bit words, while GBE data is aligned on 10-bit boundaries. To handle this difference, the alignment block 400 either outputs three or four 10-bit words on line 402, using an enable signal on line 404 to notify the downstream blocks that the fourth 10-bit word is present.

The error monitor 406 checks for synchronization. It is a circuit searching for another K28.5 byte. If one is found with a different alignment, the circuit 406 pulses the SYNC_LOSS signal on line 408 for 2 CLKOUTP/N periods, sets the sync loss interrupt bit and signals the alignment block 400 on line 410 to change to the new alignment. This circuit 406 may be changed to the standardized, IEEE 802.3z state machine if the 'IEEE ON' register bit is set. The IEEE algorithm generates a SYNC_LOSS error indication that is a level signal as opposed to the pulsed signal described above. SYNC_LOSS will be active while synchronization is lost and will be inactive once the state machine synchronizes. When synchronization is lost, the alignment block 400 searches for comma characters with new alignments.

The error monitor 406 checks the 10-bit words for invalid codes. It 10 indicates that the received character is not a valid codeword considering the current running disparity. Even if the codeword appears in the Valid Code Group Table 36-1&2 in IEEE 802.3z, the current running disparity might disqualify the codeword from being valid. If the codeword does not appear in the IEEE802.3z table, the codeword is not valid. When an invalid code is found, the INV_CODE I/O pin on line 412 pulses for two CLKOUTP/N periods.

Figure 12:
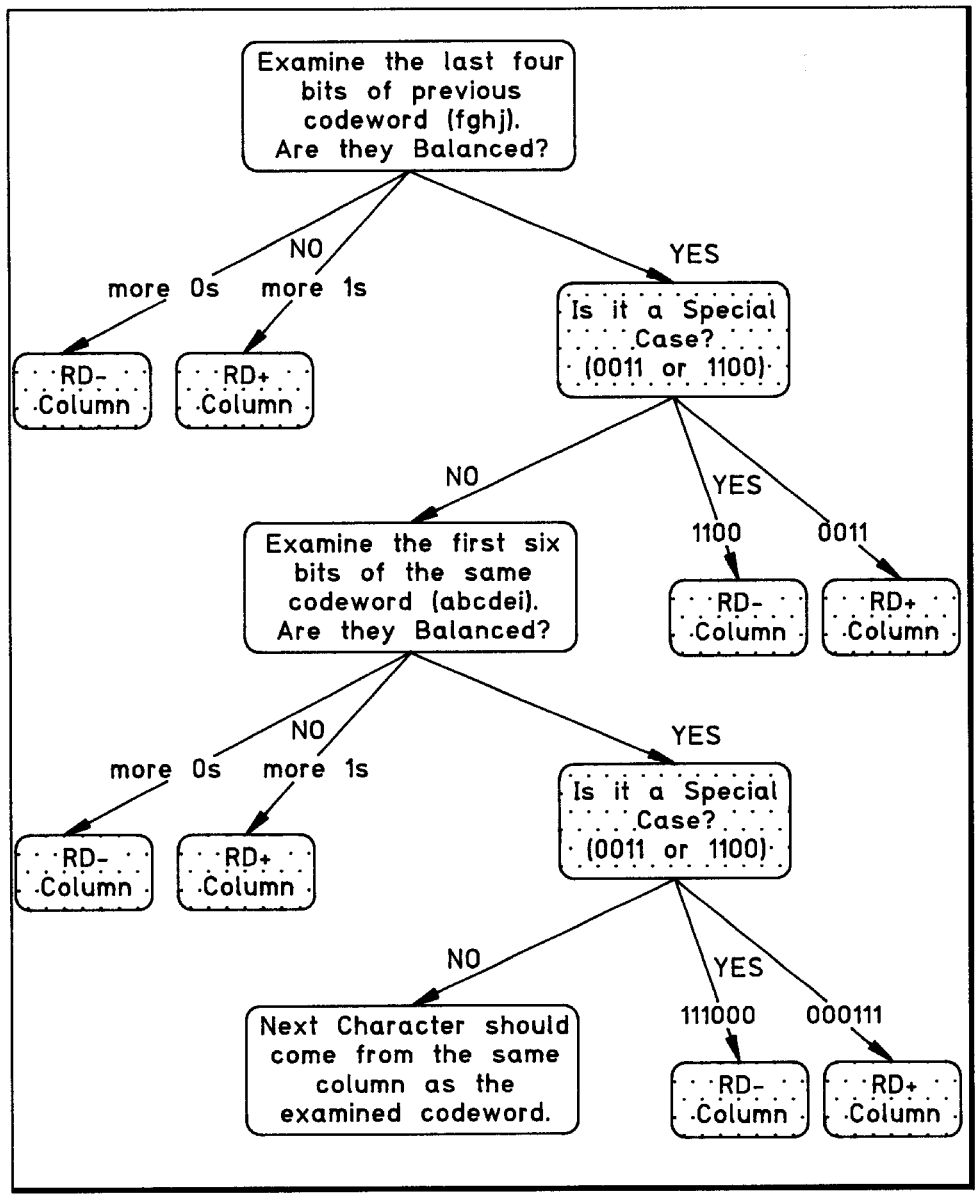
FIG. 12 is a logic diagram depicting the determination of a running disparity (RD) error.

FIG. 12 is a logic diagram depicting the determination of a running disparity (RD) error. Only errors in the data stream (i.e. invalid code words) can cause characters composed of more than 6 ones or 6 zeros. The received codeword is used to calculate the new value of running disparity, regardless of the character's validity. If the received codeword is found in a different column of the802.3z Valid Data Character table than expected, a RD error will be discovered and an INV_CODE will be declared. This determination is made independent of the parity calculation.

The RD calculation is only used for codeword validation. A separate RD error count/flag is not available to the user. The user may, however, correlate the parity error count to the invalid code count to determine the cause of the failure.

FIG. 12 depicts the methodology used to determine which running disparity column (RD- or RD+) of the IEEE 802.3z Valid Data Character table to find the next received/sent 8B/10B code word. The last four bits (f g h j) of the previous received/sent codeword are examined first. If the codeword is determined to have more ones or zeros, the desired RD column is determined and the examination of that character may stop. If the bits are balanced (has the same number of ones and zeros) and are NOT a special case (1100 or 0011), the first six bits (a b c d e i) of that code-word must also be examined to determine the RD column location of the next codeword. If the examined six bits turn out to be balanced and are NOT a special case (000111 or 111000), the next codeword will come from the same running disparity column as the examined codeword.

An additional check is performed on the receive codeword which relates to the running disparity properties of the 8B/10B code. Any two occurrences of 10 bit characters composed of 4 logic ones (i.e. 010010 1001), without the occurrence of a character composed of 6 ones (i.e. 111010 0101) in between, is flagged as a parity error. Any number of characters with equal numbers of ones and zeros are allowed between the two characters composed of 4 ones, with no parity error. The same method applies to the alternate case where a character composed of 4 ones is required to separate any two characters composed of 6 ones, each. This mechanism ensures that both the ones and zeros density of the serial data stream are never more than a single bit from 50%, at the boundaries of any two characters. Parity error checking provides simple testing of dc balance but does not perform a full IEEE 802.3z Table 36-1&2 lookup based on an IEEE compliant RD calculation. The parity error checking provides a means of verification of non-IEEE compliant codes, which achieve DC-balance in a similar fashion. The parity error indicator is labeled as DISP_ERR on line 414.

The error status points (SYNC_LOSS, INV_CODE, and DISP_ERR) are output on individual I/O pins, on lines 408, 412, and 414, respectively. Additionally, each one of these points generates a maskable interrupt to the processor. In the case of an INV_CODE, DISP_ERR, and a SYNC_LOSS created by the single K28.5 algorithm, an interrupt is generated each time one of the signals pulses. When SYNC_LOSS is created by the IEEE algorithm, an interrupt is generated on both transitions into and out of the synchronization state. The monitors for invalid codes and parity errors each check up to four words during each clock cycle, but only output one error per clock cycle. Thus, when INV_CODE is active, it represents up to 4 invalid codes. Similarly, when DISP_ERR is active, it represents up to 4 parity errors.

Activity counts for each of these status points are accumulated, individually, in error count register 416. SYNC_LOSS activity is only counted when it transitions from in-sync to loss-of-sync for the IEEE mode and counts the number of new alignments found for the default mode. A count of the combined invalid codes and parity errors are also generated. The activity counts are 100% accurate, unlike the error signals on the INV_CODE and DISP_ERR I/O pins.

A performance monitoring tick on line 418 is used to transfer accumulating counts from the count registers 416 on line 420 into static holding registers (not shown) that can be read via the processor interface. All count registers are set to zero at the start of a given count cycle. The tick, which typically occurs every second, can come from a clock connected to the PM_CLK I/O pin or, in the case where a clock is not available, from a software write.

Table 4b describes the effect of certain types of corrupted characters on the invalid codeword and parity error counts. It is intended to be an aid in correlating the corruption type to the error count.

TABLE 4b

Invalid Codeword/Parity Error Correlation

| Corruption Type | Invalid Codeword Count | Parity Error Count |
|---|---|---|
| Received character appears in IEEE 802.3z table 36-1 or 36-2 and is the correct disparity for the current RD (i.e. it appears in the correct disparity column of the IEEE 802.3z tables). The parity of the character is either neutral or NOT neutral. | No Change | No Change |
| Received character appears in IEEE 802.3z table 36-1 or 36-2 but does NOT match the current RD (i.e. the character appears in the wrong disparity column of the IEEE tables). The parity of the character is neutral (i.e. the character is composed of an equal number of ones and zeros). | Add | No Change |

TABLE 4b-continued

Invalid Codeword/Parity Error Correlation

| Corruption Type | Invalid Codeword Count | Parity Error Count |
|---|---|---|
| Received character appears in IEEE 802.3z table 36-1 or 36-2 but does NOT match the current RD. The parity of the character is NOT neutral (i.e. the character does not contain an equal number of ones and zeros). | Add | Add |
| Received character does NOT appear in IEEE 802.3z table 36-1 or 36-2. The parity of the character is neutral. | Add | No Change |
| Received character does NOT appear in IEEE 802.3z table 36-1 or 36-2. The parity of the character is NOT neutral. | Add | Parity OK: No Change Parity Error: Add |

SONET/SDH

Returning briefly to FIGS. 4a and 4b, in SONET/SDH mode, the data enters the device through the de-multiplexer 66, or through the differential decoder 54, or through the FEC decoder 54, and enters the FIFO 300 as described in the pass-through section above. The data then continues on to the transport overhead monitoring block 32 that is described below.

Figure 13:
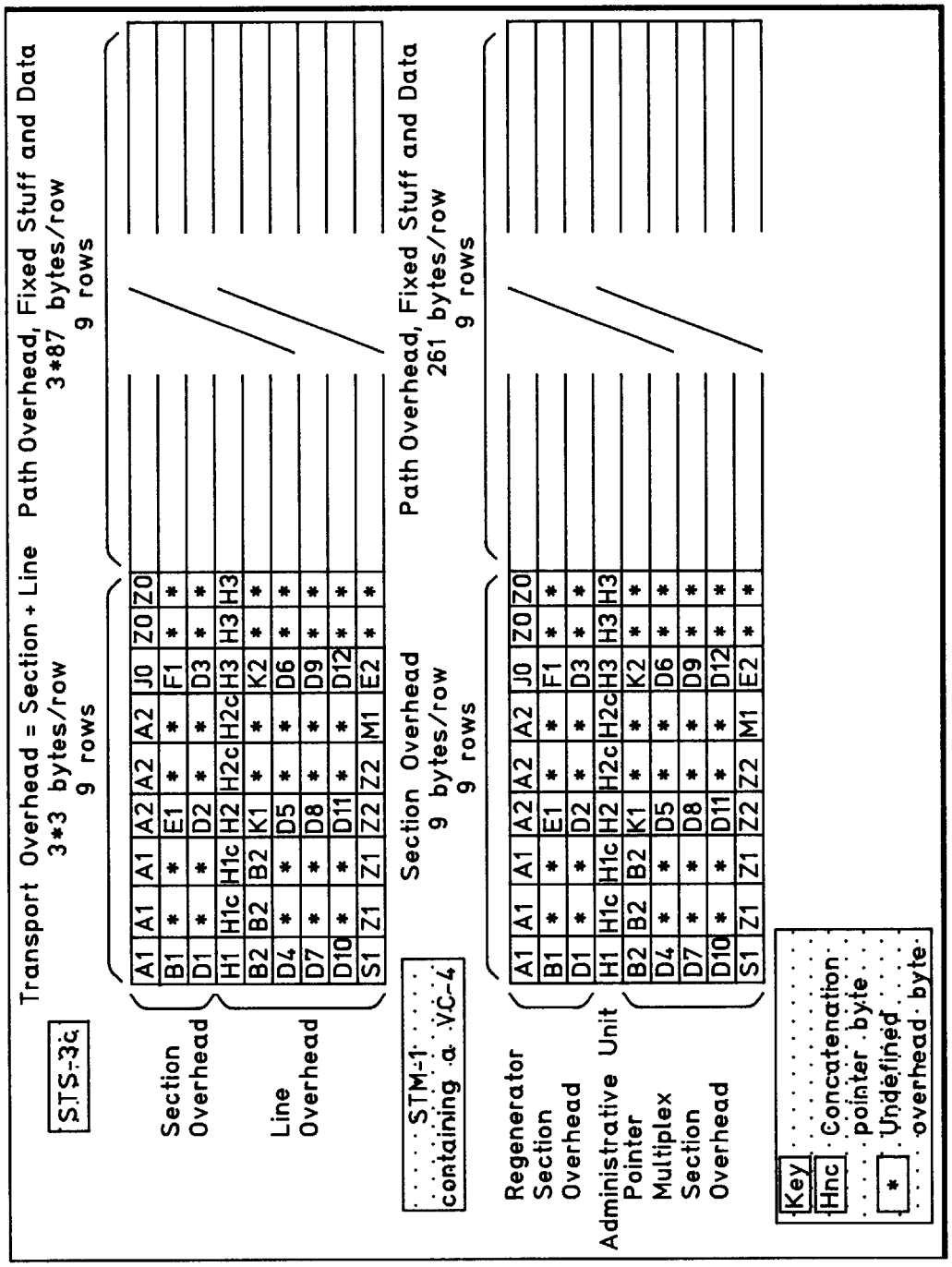
FIGS. 13 and 14 depict exemplary SONET frame structures, including the locations of the transport overhead bytes within the SONET/SDH frame.
Figure 14:
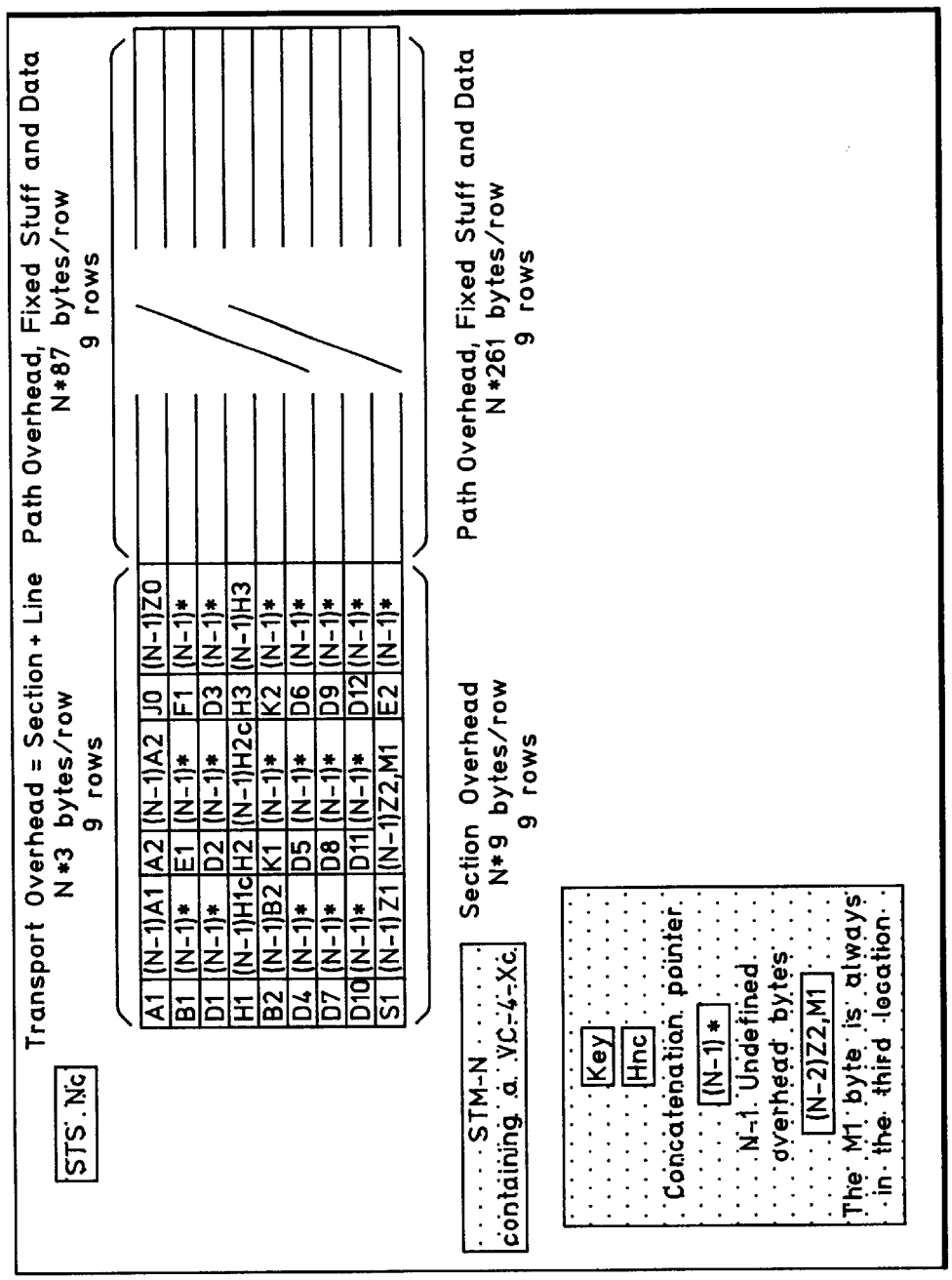

FIGS. 13 and 14 depict exemplary SONET frame structures, including the locations of the transport overhead bytes within the SONET/SDH frame. After the receive data has run -through the FIFO, the LOS block of SONET monitor monitors it for all zeros. When 26.337 µs have passed with only zeros being. detected, a loss of signal (LOS) is declared (active high) and sent to both an I/O pin and an interrupt bit in a software register. LOS is de-activated following the detection of two valid, consecutive frame alignment patterns without a LOS re-occurring. A performance monitoring tick is used to transfer to the PM register a single-bit indication of whether or not LOS has occurred since the last tick. This register is provided to simplify the gathering of performance monitoring statistics according to the SONET/SDH standards.

The performance monitoring tick, which typically occurs every second, can come from a clock connected to the PM_CLK I/O pin or, in the case where a clock is not available, from a software write.

The Frame and Byte Alignment block examines the data stream coming from the FIFO for 3 A1s and 3 A2s, which determine both the byte and the frame boundaries. Having found, the boundaries, the block then sends a frame pulse to the Frame Counter and arranges the data stream so that it is byte aligned for the following blocks. Then the block stops monitoring the data until the Frame Check block indicates that it is Out-of-Frame (OOF) and a search for a new alignment and frame must be started. Note that while this block is searching, the data continues to pass with the previous alignment. Data is unaffected until this block sets the new boundaries.

The Frame Check block determines whether the receiver is in-frame or out-of-frame. In-frame is defined as the state where the frame boundaries are known. Out-of-Frame (OOF) is defined as the state where the frame boundaries of the incoming signal are unknown. OOF is' declared when a minimum of four consecutive erred framing patterns have been received. The maximum OOF detection time is 625 µas for a random signal. The SONET specification requires that the framing algorithm used to check the alignment is designed such that a $1 \times 10^{-3}$ BER does not cause an OOF more than once every 6 minutes. The S3062 algorithm examines the last A1 byte and the first four bits of the first A2 byte for a total of 12-bits to guarantee this requirement.

When in an OOF condition, this block moves back to the in-frame condition upon detecting two successive error-free framing patterns. This implementation of the frame check circuit clears OOF within the required 250 ms interval. Failure to obtain a frame within 3 ms (OOF persists for 3 ms) results in a Loss-of-Frame (LOF). Both OOF and LOF signals are connected to I/O pins and register bits to keep the user informed of the S3062's state. Similarly to LOS, the performance monitoring tick transfers to the 'PM register' a single-bit indication of whether or not OOF occurred since the last tick. NOTE: OOF is also referred to as Severely Erred Frame (SEF) in the SONET standards.

Figure 15:
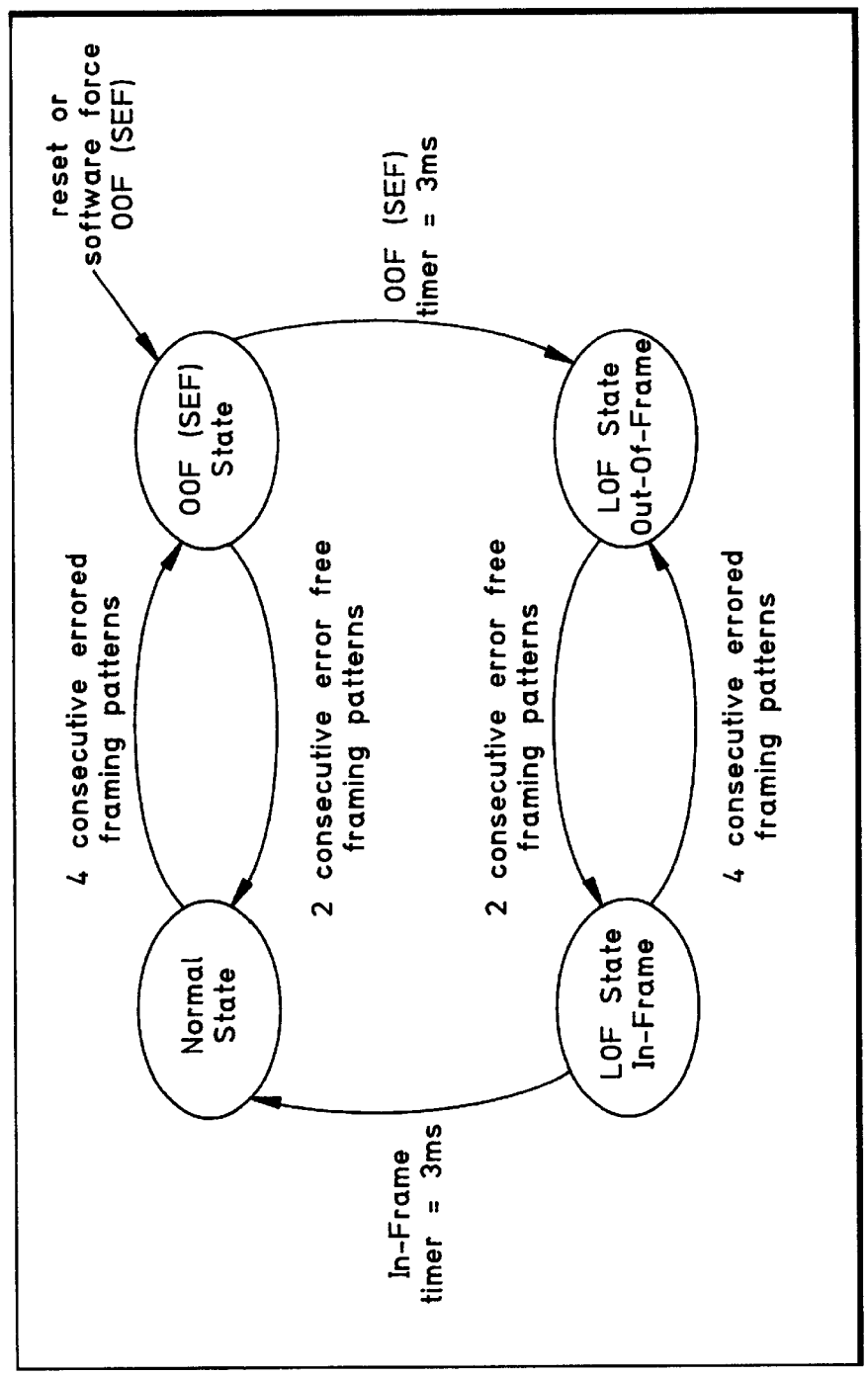
FIG. 15 is a logic diagram illustrating the operation of the LOS/OOF state machine.

FIG. 15 is a logic diagram illustrating the operation of the LOS/OOF state machine. The LOF error indication is implemented by using a 3 ms integration timer to deal with intermittent OOFs when monitoring for LOF. The 3 ms integration timer consists of an OOF timer and an in-frame timer that operates as follows:

The in-frame timer is activated (accumulates) when in-frame is present. It stops accumulating and is reset to zero when OOF is present; and The OOF timer is activated (accumulates) when OOF is present. It stops accumulating when the signal goes in-frame. It is reset to zero when the signal remains in-frame continuously for 3 ms (i.e., the in-frame timer reaches 3 ms).

The LOF state will be entered if the accumulated OOF timer reaches the 3 ms threshold. The LOF state will be exited when the in-frame timer, reaches 3 ms. FIG. 15 depicts the LOF and OOF (SEF) state machine that is implemented.

The frame pulse from the Frame and Byte Alignment block resets the counter within this block to the frame boundary. The counter operates at STS-3/STM-1, STS-12/STM-4, or STS-48/STM-16, depending on RATESEL[1:0] inputs. It counts bytes (9 rows×90 columns×N STS-1s) to find the location of all overhead bytes and generate the timing signals and enables required by all of the other blocks. As an example, it generates a signal which controls when the scrambler block scramble, or does not scramble the bytes. It also generates an enable for the insertion of the B1 byte at the correct time and another for the insertion of the B2 byte.

The Section Trace block receives a signal from the Frame Counter block indicating the location of the J0 byte. This block checks the J0 byte for a repeating message which is either 1, 16 or 64 bytes long, as defined by the 'Length' register bits. A programmable register also defines the required number of repetitions (either 3 or 5) that must be seen before the J0 message is considered valid. Messages are compared against a message specified by the expected section trace memory and mismatches are flagged. Inconsistent errors are also flagged when no repeating messages are seen. Similarly to LOS, the performance monitoring tick transfers to the 'PM Register' a single-bit indication of whether or not a mismatch and/or an inconsistent error occurred since the last tick.

SONET format instead of SDH, and vice versa for the 64-byte message.

If the start of the message is unknown, or the defined message start is neither of the two possibilities described above, hardware may store the messages using the Section Trace memory as a circular buffer. The circular buffer may be enabled by setting the 'Circular Buffer' bit in the 'Section Trace Control: Receive and Transmit' register. The message length may also be set to 1, 16 or 64 bytes by setting the 'Length' bits.

The algorithm used to detect problems in the trace message must be robust to bit errors. This block's algorithm defines valid messages, mismatches and inconsistent errors in accordance with Table 5.

TABLE 5

Section Trace Definitions

| | |
|---|---|
| EXPECTED MESSAGE | The value stored in the 'Expected Section Trace Message' register. This is user programmable. |
| MATCHED MESSAGE | A MATCHED MESSAGE is an incoming message that is identical to the EXPECTED MESSAGE. |
| MISMATCH MESSAGE | A MISMATCHED MESSAGE is an incoming message that differs from the EXPECTED MESSAGE. |
| VALID MISMATCH MESSAGE | A VALID MISMATCHED MESSAGE is an incoming MISMATCHED MESSAGE that differs from the expected message but has been received 3 (default) or 5 consecutive times. The number of received, consecutive values is programmable with the 'Check 5' register bit. The times required to receive a VALID MISMATCHED MESSAGE of length 1, 16, 64 in a system with a BER of 0 or $1 \times 10^{-3}$ are shown in Table 10. |
| VALID MATCHED MESSAGE | A VALID MATCHED MESSAGE is an incoming MATCHED MESSAGE that has been received 3 (default) or 5 times, without a VALID MISMATCHED MESSAGE received in between. The number of received, consecutive values is programmable with the 'Check 5' register bit. The times required to receive a VALID MATCHED MESSAGE of length 1, 16, or 64 in a system with a BER of 0 or $1 \times 10^{-3}$ are shown in Table 8. Permitting validation of expected messages to occur without requiring the messages to arrive consecutively shortens the validation time when the bit error rate is high. See Table 8 and Table 10. |
| INCONSISTENT ERROR | An inconsistent error is declared if neither a VALID MISMATCHED MESSAGE nor a single MATCHED MESSAGE have been seen in 4 times the time which would normally be required to detect 3 or 5 MATCHED MESSAGES in the presence of BER of $1 \times 10^{-3}$. Reception of a VALID (MATCHED OR MISMATCHED) MESSAGE clears the inconsistent error. Table 9 shows the length of time hardware spends in searching for a valid mismatch or a single expected message before declaring an inconsistent error. Note that the values of Table 9 are 4 times the worst-case values in Table 8. |

The block can, if requested, search for a message start and put it in the first location in memory. By default, 16-byte messages are expected to have a 1 in the most significant bit of the first byte of the message and 0s in that bit position for the other 15 bytes. Therefore, if a message is 16 bytes long, the byte to go in the first memory location will contain a value of 1 in the MSB. This is compliant with SDH Section Trace Messaging as stated in G.707. By default, 64-byte messages are expected to be ASCII strings terminated by a carriage return and a line feed (0x0d and 0x0a). Therefore, if the message is 64 bytes long, the byte to go in the first location in memory will be the one following the line feed. This is compliant with SONET Path Trace Messaging as stated in GR-253-CORE. The defaults may be overridden for both message lengths by setting the 16-byte message to

TABLE 6

Time Required to Receive a VALID MATCHED MESSAGE

| BER | 1-byte Message | 16-byte Message | 64-byte Message |
|---|---|---|---|
| BER = 0, detect = 3 | 375 µs | 6 ms | 24 ms |
| BER = 0, detect = 5 | 625 µs | 10 ms | 40 ms |
| BER = $1 \times 10^{-3}$, detect = 3 | 750 µs | 22 ms | 192 ms |
| BER = $1 \times 10^{-3}$, detect = 5 | 1 ms | 28 ms | 224 ms |

TABLE 7

Time Required to Detect an INCONSISTENT ERROR

| BER | 1-byte Message | 16-byte Message | 64-byte Message |
|---|---|---|---|
| BER = 1 × 10⁻³, detect = 3 | 3 ms | 88 ms | 768 ms |
| BER = 1 × 10⁻³, detect = 5 | 4 ms | 112 ms | 896 ms |

It is unlikely that a false INCONSISTENT ERROR will be raised if the expected message is being sent. Note, however, that when the bit error rate is high, and an incorrect message is being sent, it is more likely that an INCONSISTENT ERROR will be raised than a MISMATCH, especially in the case of a 64-byte message. The reason being is that the probability of receiving three consecutive sets of 64-bytes with no errors is small when in the presence of a BER of $1 \times 10^{-3}$. To increase the probability of receiving a VALID MISMATCHED MESSAGE, one must increase the amount of time one is willing to wait. For a probability >99.9999%, one must wait the times shown in Table 8 below. Tables 7 and 8 may be consulted to verify that the probability of receiving an INCONSISTENT ERROR is greater than a MISMATCH in the presence of a high bit error rate.

TABLE 8

Time Required to Detect a VALID MISMATCHED MESSAGE

| BER | 1-byte Message | 16-byte Message | 64-byte Message |
|---|---|---|---|
| BER = 0, detect = 3 | 375 µs | 6 ms | 24 ms |
| BER = 0, detect = 5 | 625 µs | 10 ms | 40 ms |
| BER = 1 × 10⁻³, detect = 3 | 2.2 ms | 120 ms | 2.4 s |
| BER = 1 × 10⁻³, detect = 5 | 2.6 ms | 280 ms | 24 s |

Note that the times during the BER of $1 \times 10^{-3}$ are approximate. There is a small probability ($1 \times 10^{-10}$) that the messages still will not be received, in the times shown.

EXAMPLES

1. BER=0, expected 16-byte message='A', the expected message is being received, no section trace errors are showing and the message detect time has been set to 3. The S3062 sees:

. . . AAAAAAAAAAAAAAAA . . .

2. The network connections upstream of this node are changed and this device starts seeing 16-byte message 'B':

. . . AAAABBB

After the third B, it declares a mismatch and interrupts software which then reads 'B' in the receive section trace memory. The time taken to discover the mismatch after the connection was switched is, in this example, 6 ms: 3 messages*16 bytes/message*1 frame/msgbyte*125 µs/frame.

3. Software informs the network of the problem and the connections are fixed, but now there is a BER of $1 \times 10^3$ on the line. The S3062 sees large numbers of random garbage messages ('g') because of all the bit errors:

. . . BBBBggAggggAgA

After the third expected message, the S3062 clears the mismatch and interrupts the software to tell it of the change. The software can then read 'A' in the receive section trace memory. The time taken to clear the mismatch after the connection fix is, in this example, 10 messages*16 bytes/message*1 frame/msgbyte*125 µs/frame=20 ms.

4. Now the connections get disturbed again and message 'B' is once more being sent, but the line still has a BER of $1 \times 10^{-3}$ on it.

. . . ggAgBggBgBBgBgBggBgggBgggBBg-gBBgBgggBBggBgBBggB

The S3062 needs to see 3 'B's in a row to be able to say with certainty that it is getting a valid, mismatched message, not just a bunch of noise. In this example, it does not get 3 'B's in a row before hitting the inconsistent error's timeout value of 88 ms. Therefore, an inconsistent error is declared. Note that there is no reason to read the receive section trace message memory. With the bytes changing inconsistently, there is no message to store, so that whatever the last valid message was (in this example, 'A') will still be there.

An 'As-is' option allows the received J0 message to be written into the receive section trace memory without validation. If the circular buffer is not enabled the message start search may be used. When a new message start is seen, the old message will be written into the received memory and a new message collection started. If no message start is seen, then the message will be written to memory when the correct length (1, 16 or 64) has been received. This will permit messages, which are less than 16 or less than 64 bytes long, to be lined up correctly in the receive memory.

If the circular buffer is enabled in 'As-is' mode, the messages will be transferred to the receive memory after the specified bytes (1, 16 or 64) have been received. In this case, if a 64-byte message is selected, memory need be read only once every 8 ms (64*125 µs) to see new values. To create an 8 ms timer synchronized to the S3062, connect FPOUTB to an interrupt and count 64 frames.

All the bytes in the SONET/SDH data stream, with the exception of A1, A2 and J0/Z0, are normally scrambled and must be descrambled before further overhead processing can be completed. The descrambler and scrambler algorithms are identical, using a generator polynomial of $1+x^6+x^7$ with a sequence length of 127. The algorithm is frame synchronous, being reset to "1111111" on the most significant bit of the first byte following the last byte of the first row (last Z0 byte) of the STS-N/STM-M section overhead. This bit and all subsequent bits to be scrambled are added modulo 2 to the output from the $X_7$ position of the scrambler.

The Section BIP-8 block receives data from both the scrambled and descrambled data streams. Bit interleaved parity (BIP) is calculated on the scrambled data. Bit interleaved parity-8 (BIP-8) is a method of error monitoring. SDH standard G-707 specifies it as follows:

"Even parity is generated by setting the BIP-8 bits so that there is an even number of 1s in each monitored partition of the signal. A monitored partition comprises all bits that are in the same bit position within the 8-bit sequences in the covered portion of the signal. The covered portion includes the BIP-8".

The result is then compared with the descrambled B1 byte. Mismatched bits are defined as errors and are shown at the B1ERR output pin and counted internally. If block error counting has been selected, 1 error is counted and shown at the B1ERR output pin and for each erred B1 byte. If block error counting is not selected, 1 error is counted and shown at the B1ERR output pin for each bit that is mismatched (up to 8 errors possible per byte).

A performance monitoring tick is used to transfer the accumulating error count into a static holding register that can be read from the processor and FPGA interfaces. The accumulation counter is then reset to zero. The tick, which typically occurs every second, can come from a clock connected to the PM_CLK I/O pin or, in the case where a clock is not available, from a software write to the 'PM Tick' bit.

The tick also transfers, to the 'PM Register' a single-bit indication of whether or not a B1 error has occurred within the last second. Thus software can read or not read the count registers based on whether or not the bit is set. Since all of the SONET/SDH counts have an indicator bit in the 'PM Register', one read of the 'PM Register' would let software know the necessity of further reads.

After the B1 byte has been checked, the data passes on to the line AIS Multiplexer #1. If the user has not requested that line AIS be automatically inserted then the data will go straight through the Line AIS Multiplexer #1. If LOS or LOF has been detected and automatic AIS insertion has been selected, all but the section overhead bytes will be replaced with 1s. The SONET/SDH specifications require the insertion of AIS upon the receipt of LOS or LOF to prevent downstream blocks from monitoring bad data. A user-requested AIS has no effect on this multiplexer; it only affects the downstream Line AIS Multiplexer #2. This is so that the user may request a downstream line AIS and still monitor the line overhead.

Given that the Line AIS Multiplexer #1 has not turned all the line overhead bytes into FFh, the Line BIP-8 block can check the B2 bytes. The B2 byte is allocated in each STS-1 frame for a line error monitoring function. In an STS-N there are therefore N B2s, each one the result of a BIP-8 calculation over a single. STS-1 excluding its section overhead. To check that the incoming B2s have been generated correctly, the BIP-8 values are recalculated over the line overhead and the SPE bytes for each STS-1 in each frame after descrambling. The results are then compared to the incoming B2s after descrambling.

If the user has selected block error counting, 1 error is counted for each erred B2 byte. If block error counting is NOT selected, 1 error is counted for each bit that is incorrect (up to 8 errors possible per B2 byte).

A performance monitoring tick is used to transfer the accumulating error count into a static holding register that can be read from the processor and FPGA interfaces. The counter is then reset to zero. The tick, which typically occurs every second, can come from a clock connected to the PM_CLK I/O pin or, in the case where a clock is not available, from a software write to the 'PM Tick' bit. To enable the tick to come from software, the user must enable the 'PM Tick ON' register bit and activate the Micro Present byte. Then, the user must generate the tick by, every second, writing to the 'PM Tick' bit.

The tick also transfers, to the 'PM Register', a single-bit indication of whether or not a B2 has error occurred within the last second. Thus software can read or not read the count registers based on whether or not the bit is set. Since all of the SONET/SDH counts have an indicator bit in the 'PM. Register', one read of the 'PM Register' would let software know the necessity of further reads.

The Bit Error Rate block accumulates all B2 bit errors and asserts Signal Fail (SF) or Signal Degrade (SD) to the processor and FPGA interfaces if the number of errors cross pre-set thresholds after pre-set times. The Threshold and Accumulation Period values are software programmable. The threshold and time values default to $1\times10^{-3}$ for signal fail and $1\times10^{-5}$ for signal degrade so that this circuit can still be useful if a processor is not connected.

Software must also implement the SONET/SDH fault clearing, after receiving an indication of SF or SD by:

setting the Threshold and Accumulation Period registers to one tenth of the existing BER value;

polling the SD and SF interrupts to see when that one tenth BER indication clears. After the fault has cleared, software can then set the SF or SD Threshold and Accumulation Period registers back to their normal values.

The automatic protection switching (APS) block monitors the least significant 3 bits of the K2 line overhead byte for the Line Alarm Indication Signal (AIS_L: 111) and the Line Remote Defect Indication (RDI_L: 110). If a specified number of consecutive AIS_L values are seen, AIS_L is asserted in a status register, which is accessible by the processor and FPGA. The AIS_L indication is removed when the same number of consecutive non-AIS_L values are seen. RDI_L is handled the same way. The number of consecutive values can be either 3 (for the SDH standard) or 5 (for the SONET standard). This number of consecutive values is configurable via a processor interface control register (default value is 5). Changes of state in AIS_L and RDI_L (to/from AIS_L/RDI_L present/not present to not present/present) indications generate interrupts. Similarly, the performance monitoring tick transfers to the 'PM Register' a single-bit indication of whether or not AIS_L and/or RDI_L occurred since the last tick.

The block also monitors K1 and K2 for new values. If a new value of K1 or K2 is seen for 3 consecutive frames, it is latched for software to read and an interrupt is raised. If no consistent K1 value is seen for 12 frames, an "inconsistent K1" alarm is flagged to software. K1 and K2 are used for protection switching.

The synchronization block monitors the S1 line overhead byte for 8 consecutive identical values in the least significant 4 bits. If the nibble differs from the previously acquired S1, the new value replaces the old in a register accessible through the processor and FPGA interfaces. If the new nibble is different from an expected value written in by software,, a mismatch is flagged. If the new nibble is the same as the expected value the mismatch is cleared. If 32 frames go by without 8 consecutive identical values, an inconsistent value indication is flagged. To decide that the synchronization source has truly failed, as defined by the standards, software must start a 10s counter as soon as it receives the inconsistent value indication. If no valid message is detected before the counter runs out, the software must consider that the synchronization reference failed.

The standards specify a 10-second invalid S1 value, not the 32-frame inconsistent value indicator. The 32-frame inconsistent value indicator was designed to assist software and to create a function similar to the K1/K2 standard. The S1 byte is considered valid after 8 consecutive frames and inconsistent after 4 times this interval, or 32 frames.

The S1 value and its error indications are only of use if there are 2 synchronization sources to choose from. If the S3062 device is being used in a repeater, there will only be one clock source available, and no action will be taken if the synchronization reference fails. The user will simply ignore all the S1 information.

The STS-N/STM-M M1 byte contains the addition of all the B2 errors that were detected at the far-end. This count is called the Remote Error Indication (REI). The way REI works is as follows:

System X is connected to System Y. Data flows from X to Y and also from Y to X. There is a problem with X's transmitter causing intermittent bit errors. Y sees these errors when it checks B2. It counts them up and sends the count back to X in the M1 byte. X looks at the M1 byte, sees the errors and checks its transmitter. It finds the fault and repairs it.

Since REI reports what the far-end is seeing, it is only useful if the S3062 chip resides in a system where traffic is bi-directional. In a uni-directional system, this data may be kept for performance monitoring statistics.

For statistics, the block adds up the REI values until the performance monitoring tick is received. Just like the B1 and B2 counts, the tick transfers the count to a register accessible by the processor or the FPGA and clears the counter. If no tick is received, the counter stops counting when it reaches a maximum value of 1FE000h errors which is the maximum number of errors that could be received on a STS-48/STM-16 link in a 1.024 seconds. The tick also transfers, to the 'PM Register', a single-bit indication of whether or not a REI error occurred within the last second.

The capability of transmitting a user defined value for the M1 byte using overhead insertion via the TX_OH memory is supported if the user wishes to supply the B2 error count arriving in the other direction.

The serializer block serializes onto pins the section and line orderwire (E1 and E2) and the section and line data communication channels (D1–3 and D4–12). The block also generates a gapped 9.72 MHz clocks for the output serial streams. The 9.72 MHz frequency increases by the FEC encode bandwidth expansion factor if FEC encode is ON. The orderwire also requires a frame pulse from this block to mark the most significant bit of the byte. Since the DCCs are bit, not byte oriented, no frame pulses or byte markers are required.

The orderwire must go to an external circuit designed especially for it, but the DCCs may be connected directly to serial HDLC processors such as the MPC860. If the protocol on the DCCs is not standard HDLC, the MPC860 SCC ports may still be used; program them in transparent mode. If the protocol is byte-oriented, the orderwire frame pulses may be used to indicate the first DCC's most significant bit. In this case, however, an external circuit will likely be needed because the orderwire frame pulse is not lined up directly with the DCCs' most significant bits.

Twenty user accessible pins are used by this block and the parallelizer (2 orderwire clocks, 2 orderwire frame pulses, 2 section DCC clocks, 2 line DCC clocks, 4 data out, 4 data in and 4 enable data in). They are also shared by the FPGA port. A FPGA may be connected to extract and insert all the overhead bytes, or, individual devices may be connected to the serial orderwire and DCC ports.

If the FPGA port is not selected, all the DCC signals generated by this block will continue to run, even when the chip is in LOS or LOF. If the data is extracted during a LOS or LOF condition, the data will be garbage. Upon re-acquisition of byte alignment following a LOS or LOF, the location of the frame relative to the previous alignment may have changed. This may lead to extra/fewer bits and serializer clocks in a frame, but the clock period will not be affected.

All received section and line overhead bytes are captured frame-by-frame in the Receive Overhead Memory (RXOH). The memory is divided into 2 pages, X and Y. During the first frame, the overhead bytes are written into page X while the processor and/or the FPGA interface read out of page Y. At the beginning of the next frame, the two pages are swapped and bytes are written into page Y while page X can be read by the processor and/or FPGA. At the beginning of the next frame the pages are swapped again.

The two pages are transparent to the user. If the overhead data is going out the FPGA interface, it looks like a steady stream of overhead data. If software is reading the transport overhead from memory via the processor interface, it always uses the same address to access a particular overhead byte; the address does not change with the page swap. The 2 pages cause a full frame delay between the time the overhead arrives on the chip and the time that it can be read out of the RX_OH memory.

The Overhead Extract State Machine block controls all of the accesses to the Receive Overhead Memory (RX_OH). Write addresses are generated as required to one of the RX_OH pages (page X, for example) while the entire frame of section, and line overhead bytes are written in from the receive data stream. If the FPGA interface is selected (FPGASEL), then at the same time as page X is being written, the state machine generates read addresses for page Y. 32 bits are read at a time, then held and output to the 8-bit, FPGA interface. All 1296 overhead bytes (N×27) for an STS-48/STM-16 signal are sent out, in order from the first A1 to the last byte in the 2/undefined column. Following the last byte, the values in the SONET/SDH fault and performance monitor registers (registers 010h to 019h) are sent out, in the order they are shown in the register map, most significant byte first. The rate of the FPGA interface is 19.44 MHz for STS-12/STM-4 and STS-48/STM-16 and 1.62 MHz for STS-3/STM-1. The frequency increases by the FEC encode bandwidth expansion factor if FEC encode is ON.

The Overhead Extract State Machine arbitrates access to the RX_OH memories between the FPGA port and the MPC860, giving the FPGA priority. If both the microprocessor and the FPGA port request a read, the processor's read will be delayed until the FPGA read is complete. If no FPGA is present (indicated by the FPGASEL signal being inactive), then the processor interface has exclusive read access of the RX_OH memories.

After all of the receive data and overhead has been monitored and read, the transmit blocks may modify or overwrite the data. With respect to framing and Section BIP-8, the user may request that errors in the framing bytes, A1 and A2, be corrected to improve the chances that downstream devices will be able to frame to the signal. Touching the framing bytes will affect the section BIP-8 so that if they are corrected, the B1 byte will be recalculated.

Changes in any of the other overhead bytes or in the data will force this block to recalculate the B1 for all subsequent frames regardless of the state of FIXSOH. Section BIP-8 is calculated over the entire scrambled STS-N/STM-M frame, after the overhead has been modified, and inserted into the B1 byte location of the next frame before going through the scrambling process.

With respect to Section Trace, if the 'Send J0 Msg' register bit is enabled, the Section Trace block will repeatedly send out, one byte per frame, the data which was written into the 'Transmit Section Trace Memory'. The message length (1, 16 or 64 bytes) is set in the section trace register and is the same for both transmit and receive messages.

Individual B2 BIP-8s are calculated over all of the bytes, with the exception of the section overhead, for each STS-1 in the previous STS-N/STM-M frame before scrambling and after any overhead byte insertions or modifications. They are supplied to the Overhead Multiplexer in the appropriate B2 locations of the current frame before scrambling. The multiplexer checks the various enable signals to decide whether to accept the B2s for insertion or keep the received B2s.

The overhead multiplexer block overwrites the received A1, A2 and B1 with the fixed framing bytes and recalculated B1 if the FIXSOH, Fix Section Overhead, feature has been requested. It also accepts the recalculated B1 if any changes to overhead or data are being or have been made by any of the other transmit blocks. If the Micro Present byte is active and transmit section trace enabled, the multiplexer will overwrite the received J0 byte with the byte from the 'Transmit Section Trace Memory'. B2 bytes are taken from the Line BIP-8 block rather than the receive stream if (a) B2 re-calculation has been enabled, or, regardless of the enable, if (b) any of the line overhead or data bytes are being or have been changed by up stream blocks within the S3062. The enable for B2 re-calculation comes from the FIXB2 I/O signal if the processor's Micro Present byte is inactive, or from a register control bit.

The parallelizer block brings serial orderwire (E1 and E2) and data communication channels (DCCs) into the chip and organizes them into byte format to be inserted into the transmit data stream. It generates frame pulses for the orderwire and gapped 9.72 MHz clocks for all the input serial streams. The 9.72 MHz frequency increases by the FEC encode bandwidth expansion if the FEC encoder is activated. It uses the enables provided for each stream to determine whether or not to overwrite the orderwire and DCC with the received data. If the processor is activated, the enable I/Os are ORed with the software enables so that either hardware or software can control the data insertion.

If the FPGASEL pin is selecting the FPGA; the Overhead Insert State Machine block generates a frame pulse to the FPGA and a 19.44 MHz clock for STS-12/STM-4 or STS-48/STM-16 and a 1.62 MHz clock for STS-3/STM-1 rate data. This block receives 8-bit wide overhead data bytes and overhead enables from the FPGA. If permitted, the block then writes the data into the Transmit Overhead Memory (TX_OH) and writes the enables into the 'Overhead Insert Control Memory' (OIC).

To get permission to write the FPGA data and enables into memory, the block checks the Micro Present byte. If the byte is not active, the FPGA data is written into the TX_OH and the FPGA enables are written into the OIC. If the Micro Present byte is active, the FPGA enables are completely ignored and the block checks the 'Transmit Access Control Memory' to see whether or not the FPGA data should be written into the TX_OH.

The Overhead Insert State Machine block must also take care of arbitrating the timing of accesses to the TX_OH. FPGA accesses have priority over processor accesses, which are held off until the FPGA is done. This can add a wait state to the processor access. Also, the TX_OH is divided into two pages, just like the RX_OH. This block ensures that the write and read address are directed to the correct pages.

Similarly to the Overhead Extract State Machine and Receive FPGA Interface, this block runs and produces signals for the FPGA interface even during LOS and LOF (given that the FPGASEL signal is active).

The Transmit Overhead Memory is composed of two pages just like the RX_OH. While one page is being written, either from the FPGA or the microprocessor, the other page is being read and the data sent to the Overhead Insert Multiplexer. The pages are swapped at the beginning of every frame. There is a delay between writing an overhead byte and having it inserted into the data, stream is important. With the two-page scheme, there is a guaranteed frame delay.

Software must also take the 2 pages into account if it wants to write an overhead byte and have it transmitted in multiple frames. For example, suppose software is running a protection exercise and wishes to change the value in the K1 byte to "exercise" (4 in the most significant nibble). It wishes to keep this value for the duration of the test, which takes several frames. It must write 4 into K1 in one page, then wait for the frame pulse to indicate that the frames have swapped, and write 4 into the second. Once that is done, it writes a. '1' to the OIC to enable the value to go out. For every frame thereafter, K1 will be replaced with 4. Suppose the test is done and software changes the value to 0, but it only writes the 0 in one of the 2 pages. Then the K1 being sent out will be 0 in the first frame, 4 in the second, 0 in the third, 4 in the fourth, etc. as the pages swap with each other. This will certainly cause problems for downstream devices. If software cannot guarantee that it will be able to write both pages within a few frames of each other, it should probably disable the byte insertion (write '0' to the OIC enable bit) before making any TX_OH change and only re-enable the insertion after both pages match.

The contents of the 'Transmit Access Control Memory' determines whether a given overhead byte location in the TX_OH memory is written via the FPGA port, or from the processor interface. This memory contains 1296 (STS-48×27) single bit enables, organized as 81 words×16 bits. Each bit controls processor/FPGA access to one overhead byte location in the TX_OH memory. A logic "1" in a given bit indicates that the corresponding overhead byte location in the TX_OH memory can only be written to by the processor. Any data bound for this location from the FPGA will be ignored. A logic "0" in a given bit indicates that only the FPGA data can be written into the corresponding TX_OH memory byte. Accesses from the processor will be prevented.

The contents of this memory will only function in the manner described above if a processor is actually present, as indicated by the Micro Present byte being active. If this byte is not active, then the contents of the 'Transmit Access Control Memory' will be ignored, and the TX_OH memory will be written exclusively from the FPGA port. The 'Transmit Access Control Memory' itself is exclusively accessible from the processor interface.

The 'Overhead Insert Control Memory' contains 1296 (STS-48×27) single bit enables, organized as 81 words×16 bits. Each bit controls whether or not an overhead byte which is stored in the TX_OH memory will be inserted into the transmit data stream, overwriting the received byte. The OIC memory has two ports, one read-only port on which the insert enables are read out and sent to control the Overhead Insert Multiplexer, and one read/write port which is written, either via the FPGA port, or from the processor interface. If the Micro Present byte is active, then only the processor will be allowed 16-bit read/write access to this memory, even if an FPGA is also present. If the Micro Present byte is NOT active, then the FPGA will write this memory. Each overhead byte received from the FPGA is accompanied by a TX_OH_INS signal, which is the enable for that byte. These single-bit enables are accumulated into 16-bit words and written into the 'Overhead Insertion Control Memory'. The Overhead Insert State Machine controls the sequencing of these operations.

The Overhead Insert Multiplexer block uses the enables generated from the OIC to determine whether the received data must be passed through or replaced by data from the TX_OH. If the OIC does not enable TX_OH data, and the FPGASEL signal is inactive, the block checks the enables from the Parallelizer block to determine if data from there should replace the received data. In any case, if any data is being inserted, this block signals the Section BIP-8 block to re-generate the B1. If any data other than the section overhead is being inserted, the block signals the Line BIP-8 block to re-generate B2.

This block also handles the special insertion of B1 and B2. If these bytes are enabled to come from the TX_OH, the user can request that the TX_OH value be inserted directly into the data stream or be XORed with the actual B1 or B2 value. If the Micro Present byte is not active, the XORBIP pin controls this choice; otherwise, a register bit controls it. If the B1 and B2 are not enabled to come from the TX_OH, this multiplexer will not touch them. They will have been passed through or inserted correctly by the Overhead Multiplexer and will pass through this multiplexer with the data.

There are global controls to disable insertion of overhead from the TX_OH memory regardless of the contents of the OIC. If the Micro Present byte is not activated, this control comes from the MEMOH I/O signal; otherwise it comes from the 'Insert OH' register bit. Because the OIC is not reset to a default state, one of these signals must be activated if neither processor nor FPGA are present, or if the OIC has not been written.

After getting through the Overhead Insert Multiplexer, the data passes on to the line AIS Multiplexer #2. The first line AIS multiplexer blocked bad data from getting through to the line overhead blocks in the presence of LOS or LOF as required by standards. This multiplexer repeats the process on any newly generated overhead and allows the user to force an AIS. Thus, if LOS or LOF has been detected, or line AIS is being forced, all but the section overhead bytes will be replaced with 1s. The user has two ways to request automatic AIS insertion: either through the AUTOAIS I/O pin or, if the Micro Present byte has been written, through the 'AUTOAIS' register bit. Similarly, the user can request the line AIS forced through the DATAAIS signal pin or the 'Force AIS' register bit.

After going through the line AIS Multiplexer, the data is optionally scrambled with the frame synchronous SONET scrambler. The scrambler is used to guarantee that the bit pattern does not have a long sequence of 1s or 0s in it. The generating polynomial is: $1+x^6+x^7$. It is reset to "1111111" on the most significant bit of the byte following the last byte of the first row (last Z0 byte) of the STS-N/STM-M section overhead. This bit and all subsequent bits to be scrambled are added modulo 2 to the output from the $x^7$ position of the scrambler, which runs continuously throughout the complete STS-N/STM-M frame stopping at the first bit of A1. The A1, A2, and J0/Z0 bytes are not scrambled. A set of signals from the frame counter control when the scrambler is ON, OFF, or reset.

After scrambling, the data arrives at the data off multiplexer block. The multiplexer chooses between the data and all-zeros according to either the state of the DATAOFF signal if the Micro Present byte is not active or the 'Force LOS' register bit. Finally, the data runs through the Pass-Through MUX, FEC Encoder and lastly the 2:1 MUX before exiting the chip. Note that all encoding happens after the all-zero multiplexer. The result of encoding all-zero data is the FSB followed by the all-zero data followed by-non-zero parity bytes.

For testing purposes, the S3062 may be used to generate valid transport overhead for SONET/SDH. The input clocks (CLKINP/N and TXCLKP/N) must be supplied and FIXSOH, FIXB2, and AUTOAIS must be selected either through software or hardware. Overhead insertion from the TX_OH memory must also be OFF for the A1, A2, B1 and B2 bytes. The output will be SONET/SDH frames showing line AIS. The correct J0, E1 and section DCC bytes may also be generated through software or hardware if desired.

The processor interface operates, synchronously, as a slave to a microprocessor, such as the MPC860 Communications Controller with a maximum bus speed of 50 MHz. Access to the S3062 registers is provided for the purposes of OAM&P (operations, administration, maintenance, and provisioning). All S3062 registers, including the overhead memories, are addressed as 16-bit entities by the MPC860. All memories can be accessed with both normal, single beat, as well as burst cycle transfers. Registers, however, can only be accessed one address at a time. Since the MPC860 will always be accessing registers on the S3062 as 16-bit words, then the least significant bit of MPC860 address bus (used to address byte-wide registers), will not be connected.

The synchronous, 8-word, burst mode of operation can be used in order to achieve the required <48 ns cycle times (125 us /(1296 reads+1296 writes)) for access of all of the receive, and transmit overhead bytes within a frame time. All burst accesses must be synchronized to the frame pulse signal (FPOUTB) to insure that all bytes are extracted from a single frame, and all bytes are inserted into a single frame.

Non-burst (normal single beat) access of the section trace, RX_OH, and TX_OH Memories is also provided via the MPC860 interface. For the purpose of arbitration, the FPGA (if present) will have priority over the MPC860 (if present) in gaining access to the Overhead Data Memories. Access of the 'Transmit Overhead Data Memory' (TX_OH) is further restricted by the enables contained in the 'Transmit Access Control Memory', as described in the TAC description.

The S3062's processor transfer acknowledge signal (PTA) is re-timed internally with the transmit clock (TXCLKP/N) for all accesses except the Special Clock-Independent registers. If the transmit clock fails, a processor access of any location, other than Special Clock-Independent registers, will result in a bus error. Not all of the S3062 registers are independent of the receive clock (CLKINP/N). The receive clock and the transmit clock are required to access the FEC decode registers.

Bus errors will also occur if the processor accesses registers/memories that do not exist, belong to an unselected mode or if the processor attempts to access any registers in burst mode. The Section Trace, TX_OH, RX_OH, OIC and TAC memories are accessible in burst mode.

With respect to register map details: SONET/SDH Status Registers for Failures, Alarms, PMs, and Validated Bytes. Software can read the values of the status registers for failures, alarms, PMs and validated bytes through the processor interface.

There are two type of interrupts shown in the tables that follow: Those, like B1, which only activate when an error condition occurs and those, like LOS, which activate both when the error condition starts and when it ends, i.e., upon "change of state". In the latter case, the user needs to know what the current state of the error is as well as the fact that it changed. That information is provided in the read-only "current state" bits. In all cases, '1' means that the interrupt or the condition is present. Thus, if the B1 interrupt bit is '1', a B1 BIP error has occurred, if the LOS change of state interrupt is a '1', the LOS condition has either started or ended, if the current state of LOS is now a '1', there is a Loss Of Signal error, etc. Note that the interrupt enables are in registers 00a–00c:

TABLE 9

ADDR = 0x010: Clock and APS Failures

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | RX Clk Intr | TX Clk Intr | LOS State | LOS Intr | LOF State | LOF Intr | AIS State | AIS Intr | SF Intr | SD Intr | Inconsistent APS State | Inconsistent APS Intr | New APS Intr |
| Mode | ro | ro | ro | rc | rc | ro | rc | ro | rc | ro | rc | rc | rc | ro | rc | rc |
| Default | 0 | 0 | 0 | 0 | 0 | 0 | 0 | 0 | 0 | 0 | 0 | 0 | 0 | 0 | 0 | 0 |

Note: The first read of this register may not result in the default value since states may have changed and interrupts may have arrived between the time that the chip was reset with the default value and the time that the register was read.

RX Clk Intr: 1: Interrupt present: RX input clock (CLKINP/N) failed.
0: No interrupt present.
TX Clk Intr: 1: Interrupt present: TX input clock (TXCLKP/N) failed.
0: No interrupt present.
NOTE: If the TX clock is still not running when this register is read, a bus error will occur. In that case, read the Special Interrupt Register to see the clock failure indication.
LOS State: 1: LOS has been detected and is still present.
0: LOS is NOT present.
LOS Intr: 1: Interrupt present: Change of state in LOS.
0: No interrupt present.
LOF State: 1: LOF has been detected and is still present.
0: LOF is NOT present.
LOF Intr: 1: Interrupt present: Change of state in LOF.
0: No interrupt present.
AIS State: 1: A line AIS has been detected and is still present.
0: L_AIS is NOT present.
AIS Intr: 1: Interrupt present: Change of state of AIS_L.
0: No interrupt present.
SF Intr: 1: Interrupt present: Signal Fail (SF).
0: No interrupt present.
SD Intr: 1: Interrupt present: Signal Degrade (SD).
0: No interrupt present.
Inconsistent APS State: 1: K1 is inconsistent.
0: K1 is NOT inconsistent.
Inconsistent APS Intr: 1: Interrupt present: Change of state in inconsistent APS (K1) alarm.
0: No interrupt present.
*** The RX and TX Clk Interrupts are also located in register 0x071 Special Interrupt Register. Each location has separate Interrupt Enables so please verify that the proper enables are setup for all interrupts. The enables for both RX Clk Intr and TX Clk Intr are contained in register 0x00A Clock Enable and APS Interrupts.
New APS Intr: 1: Interrupt present: New APS (K1/K2) received.
0: No interrupt present.

TABLE 10

ADDR = 0x011: BIP-8, S1, RDI and Section Trace Failures

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | B1 Intr | B2 Intr | Inconsistent S1 State | Inconsistent S1 Intr | Mismatch S1 State | Mismatch S1 Intr | New S1 Intr | RDI State | RDI Intr | Inconsistent J0 State | Inconsistent J0 Intr | Mismatch J0 State | Mismatch J0 Intr |
| Mode | ro | ro | ro | rc | rc | ro | rc | ro | rc | rc | ro | rc | ro | rc | ro | rc |
| Default | 0 | 0 | 0 | 0 | 0 | 0 | 0 | 0 | 0 | 0 | 0 | 0 | 0 | 0 | 0 | 0 |

NOTE: The first read of this register may not result in the default value since states may have changed and interrupts may have arrived between the time that the chip was reset and the time that the register was read.

B1 Intr: 1: Interrupt present: B1 BIP-8 error received.
0: Default. No interrupt present.
B2 Intr: 1: Interrupt present: B2 BIP-8 error received.
0: Default. No interrupt present.
Inconsistent S1 State: 1: S1 is inconsistent. No validated value has been found 8 consecutive times in 32 frames.
0: Default. S1 is NOT inconsistent.
Inconsistent S1 Intr: 1: Interrupt present: Change of state of inconsistent S1 message.
0: Default. No interrupt present.
Mismatch S1 State: 1: S1 is mismatched. Validated value does not match S1 expected message.
0: Default. S1 is NOT mismatched.

TABLE 10-continued

ADDR = 0x011: BIP-8, S1, RDI and Section Trace Failures

| | |
|---|---|
| Mismatch S1 Intr: | 1: Interrupt present: Change of state of mismatched S1. |
| | 0: Default. No interrupt is present. |
| New S1 Intr: | 1: Interrupt present: A new S1 value has been validated. |
| | 0: Default. No interrupt is present. |
| RDI State: | 1: Line RDI has been detected and has not been cleared |
| | 0: Default. L_RDI is NOT present. |
| RDI Intr: | 1: Interrupt present: Change of state of RDI_L. |
| | 0: Default. No interrupt is present. |
| Inconsistent J0 State: | 1: J0 is inconsistent. |
| | 0: Default. J0 is NOT inconsistent. |
| Inconsistent J0 Intr: | 1: Interrupt present: Change of state of inconsistent RX J0 message. |
| | 0: Default. No interrupt is present. |
| Mismatch J0 State: | 1: J0 is mismatched. |
| | 0: Default. J0 is NOT mismatched. |
| Mismatch J0 Intr: | 1: Interrupt present: Change of state of RX J0 message mismatch. |
| | 0: Default. No interrupt is present. |

Register map details with respect to Gigabit Ethernet (GBE) Failures and Performance Monitoring Counts now follow. There are two types of interrupts shown below: Disparity, which only activates when an error condition occurs and Sync Loss, which activates both when the error condition starts and when it ends, i.e., upon "change of state". In the latter case, the user needs to know what the current state of the error is as well as the fact that it changed. That information is provided in the read-only "current state" bits. In all cases, '1' means that the interrupt or the condition is present. Thus, if the Disparity interrupt bit is '1', a Disparity error has occurred, if the Sync Loss change of state interrupt is a '1', the Sync Loss condition has either started or ended, if the current state of Sync Loss is now a '1', there is a Sync Loss error. Note that the interrupt enables are in register 0x00C.

TABLE 11

ADDR = 0x01A: Gigabit Ethernet Failures

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | | | | | | | | | Sync Loss State | Sync Loss Intr | Invalid Code Intr | Disparity Intr |
| Mode | ro | ro | ro | ro | ro | ro | ro | ro | ro | ro | ro | ro | ro | rc | rc | rc |
| Default | 0 | 0 | 0 | 0 | 0 | 0 | 0 | 0 | 0 | 0 | 0 | 0 | 0 | 0 | 0 | 0 |

NOTE: the first read of this register may not result in the default value since states may have changed and interrupts may have arrived between the time that the chip was reset with the default value and the time that the register was read.

| | |
|---|---|
| Sync Loss State: | 1: Synchronization has been lost. |
| | 0: Default. Synchronization has been found. |
| Sync Loss Intr: | 1: Interrupt present: Change of state of sync loss. |
| | 0: Default. No interrupt is present. |
| Invalid Code Intr: | 1: Interrupt present: Invalid code received. |
| | 0: Default. No interrupt is present. |
| Disparity Intr: | 1: Interrupt present: Parity error occurred. |
| | 0: Default. No interrupt is present. |

With respect to PM Counts, note the following:

All PM counts are read-only and default to zero.

All are updated on the I second tick. If there is no tick, the register value will not change.

The "tick" is either the rising edge of PM_CLK or the change from 0 to 1 in bit 15 of register 000h, depending on which mode is enabled by the Micro Present byte and bit 1 of the Global Control register, address 001h If the tick is running, the first read of this register may not result in the default value of zero since PMs may have arrived between the time the chip was reset with the default value and the time the register was read.

A discussion of the FEC interrupt register follows.

TABLE 12

ADDR = 0x071: Special Interrupt Register

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | | | | | | | FEC OOF state | FEC OOF Intr | FIFO Intr | RX Clock Intr | TX Clock Intr | Reset Occurred |
| Mode | ro | ro | ro | ro | ro | ro | ro | ro | ro | ro | ro | rc | rc | rc | rc | rc |
| Default | 0 | 0 | 0 | 0 | 0 | 0 | 0 | 0 | 0 | 0 | 0 | 0 | 0 | 0 | 0 | 0 |

NOTE: The first read of this register may not result in the default value since states may have changed and interrupts may have arrived between the time that the chip was reset with the default value and the time that the register was read.

FEC OOF State:  1: FEC is out-of-sync.
                0: FEC is NOT out-of-sync.
FEC OOF Intr:   1: Interrupt present: Change of state of FEC decode out of sync.
                0: No interrupt present.
FIFO Intr:      1: Interrupt present: FIFO re-centering.
                0: No interrupt present.
RX Clock Intr:  1: Special Clock Fail interrupt present: RX input clock (CLKINP/N) failed.
                0: No Special Clock Fail interrupt present.
TX Clock Intr:  1: Special Clock Fail interrupt present: TX input clock (TXCLKP/N) failed.
                0: No Special Clock Fail interrupt present.
Reset Occurred: 1: The S3062 has been issued a software reset.
                0: No S3062 reset has occurred.

Control bits are available through the processor port only. If software enables processor control by writing 59h to the Micro Present byte, the register bits, and not the I/O pins, will affect the chip. There are three exceptions to this rule to permit both hardware and software control even when the software is present. When the Micro Present byte is activated:

Force Reset register bit will be ORed with the inverted hardware RESETB bit;

Orderwire and DCC enables will be ORed with their respective I/O enables; and

Inverted FEC disable bits will be ANDed with their respective I/O enables.

If the Micro Present byte is not programmed with a value of 59h, control of the chip will be available on all of the I/O pins and through the registers bits that are not shared with a pin. Only the pins listed in following three tables are affected by the value of the Micro Present byte.

Figure 16:
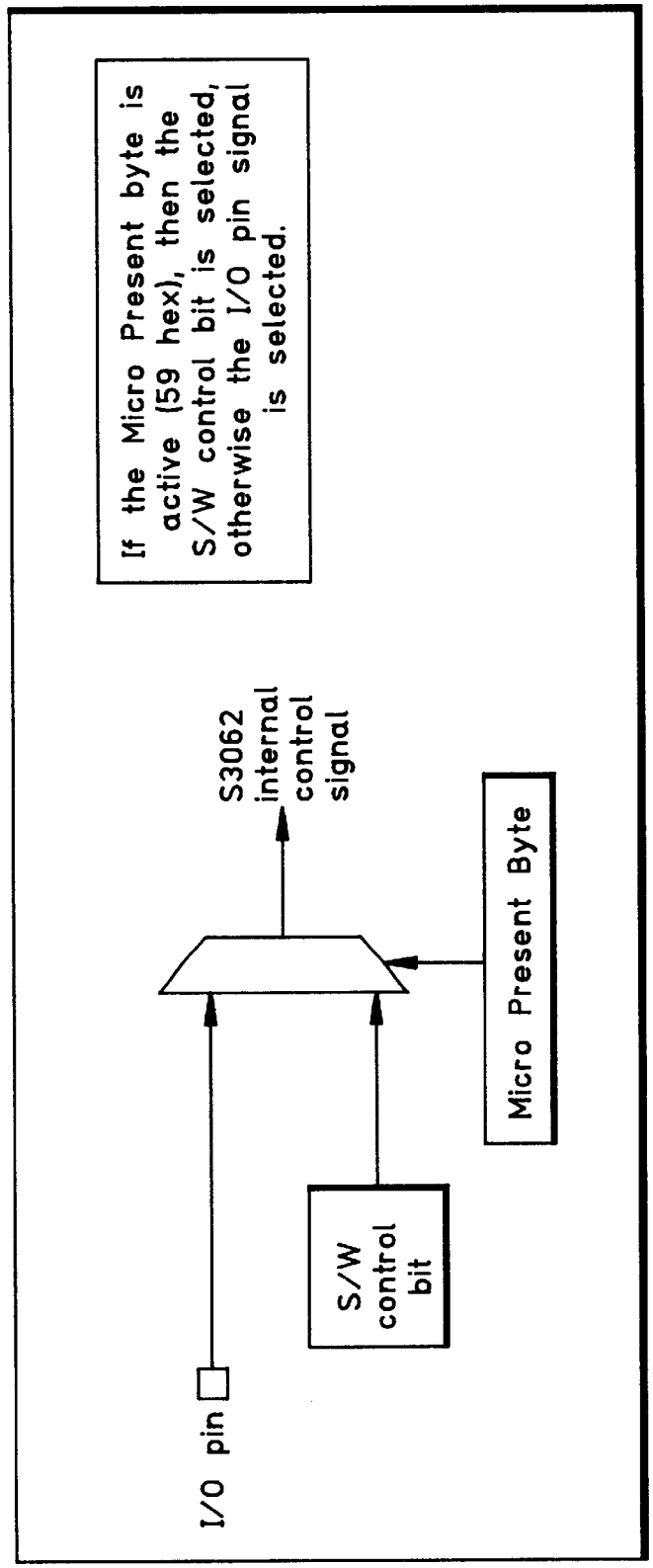
FIG. 16 illustrates the Micro Present Byte control MUX.

FIG. 16 illustrates the Micro Present Byte control MUX. An examination of FIG. 16 shows that the Micro Present byte does not affect whether or not a bit can be written. If the Micro Present byte is programmed to a value other than b 59h and the PASSTHRU pin is active, the S3062 will be in pass-through mode. When the user writes a "0" to the 'Pass-Through' register bit, to de-select pass-through mode, the chip will remain in pass-through mode until the user programs the Micro Present byte to the desired value of 59h or de-selects the PASSTHRU I/O pin. Thus, the bit can be written, but it has no effect if the Micro Present byte has not been programmed with a value of 59h. The Global control register bits and the I/O pins that provide similar functions are in the following table. All signals are active high except where noted.

TABLE 13

Shared Functions: Register Bit and I/O Pins

| Address | Bit | Bit Name | Description | I/O Pin |
|---|---|---|---|---|
| 000 | 15 | PM Tick | Transfers PM counts to registers on low to high transition. | PM_CLK |
| 001 | 6 | Force Reset | Forces a chip reset. When active low the pin resets the S3062, conversely, the bit clears a software reset. | RESETB |
| 001 | 5 | Pass-Through | Enable pass-through mode. | PASSTHRU |
| 001 | 4/3 | Rate Select | Selects the data rate. Bit selection corresponds to specific data rate. | RATESEL[1:0] |
| 001 | 2 | Force LOS | Forces SONET/SDH block output to all zeros. | DATAOFF |
| 001 | 1 | PM Tick ON | Enable for PM Tick. | Related to PM_CLK |
| 001 | 0 | Insert OH | Allows the selected bits in the OIC to determine which bytes from memory are inserted into the outgoing data stream. | MEMOH |

The SONET/SDH control register bits and the I/O pins that provide similar functions are in the continuation of Table 13. All signals are active high except where noted.

| Address | Bit | Bit Name | Description | I/O Pin |
|---|---|---|---|---|
| 002 | 9 | Descr_OFF | Enables the SONET/SDH descrambler. When active high the pin enables the descrambler, conversely, the bit disables the descrambler. | DESCRBEN |
| 002 | 8<br>7 | Block B1s<br>Block B2s | Count erred B1s (bit 8) and B2s (bit 7) by block. This means that if 6 errors occur in one byte, only 1 error is counted. A block is defined here as one byte. | BLOCKBIP |
| 003 | 11 | Scrmbl OFF | Enables the SONET/SDH scrambler. When active high the pin enables the scrambler, conversely, the bit disables the scrambler. | SCRBEN |
| 003 | 10 | Don't Fix SOH | Enables section overhead correction (A1, A2, B1). When high the pin fixes SOH while the bit does not fix SOH. | |
| 003 | 9<br>4 | XOR B1<br>XOR B2 | XOR inserted B1 values from the TX_OH with the regenerated B1s.<br>XOR inserted B2 values from the TX_OH with the regenerated B2s. | XORBIP |
| 003 | 7 | E1 ON | Enables the section orderwire to be inserted into the data stream from the external serial input pin, TX_SOW. | TX_SOW_SEL |
| 003 | 6 | SDCC ON | Enables the section DCC to be inserted into the data stream from the external serial input pin, TX_SDCC | TX_SDCC_SEL |
| 003 | 5 | Fix B2 | Recalculates the transmitted line BIP-8 (B2) byte | FIXB2 |
| 003 | 3 | E2 ON | Enables the line orderwire to be inserted into the data stream from the external serial input pin, TX_LOW. | TX_LOW_SEL |
| 003 | 2 | LDCC ON | Enables the line DCC to be inserted into the data stream from the external serial input pin, TX_LDCC | TX_LDCC_SEL |
| 003 | 1 | Auto AIS | Automatically sends an AIS downstream upon the detection of a LOS or LOF. | AUTOAIS |
| 003 | 0 | Force AIS | Forces a line AIS to downstream devices after SONET/SDH monitoring and overhead insertion. | DATAAIS |

The FEC control register bits and the I/O pins that provide similar functions are listed in the continuation of Table 13. All signals are active high except where noted.

| Address | Bit | Bit Name | Description | I/O Pin |
|---|---|---|---|---|
| 02B | 3 | FEC Encode OFF | Enables FEC encoding. When active high the pin enables FEC encoding, conversely, the register bit disables FEC encoding | FEC_ENC |
| 02B | 2 | FEC Decode OFF | Enables FEC decoding. When active high the pin enables FEC decoding, conversely, the register bit disables FEC decoding | FEC_DEC |

TABLE 14

Shared Functions: Register Bit and I/O Pin

| Address | Bit | Bit Name | Description | I/O Pin |
|---|---|---|---|---|
| 000 | 15 | PM Tick | Transfers PM counts to registers on low to high transition | PM_CLK |
| 001 | 6 | Force Reset | Forces a chip reset. When active low the pin resets the S3062, conversely, the bit clears a software reset. | RESETB |
| 001 | 5 | Pass-Through | Enable pass-through mode. | PASSTHRU |
| 001 | 4-3 | Rate Select | Selects the data rate. Bit selection corresponds to specific data rate. | RATESEL[1:0] |
| 001 | 2 | Force LOS | Forces SONET/SDH block output to all zeros | DATAOFF |
| 001 | 1 | PM Tick ON | Enable for PM Tick. | Related to PM_CLK |
| 001 | 0 | Insert OH | Allows the selected bits in the OIC to determine which bytes from memory are inserted into the outgoing data stream. | MEMOH |

Registers for performance monitoring (PM) bits and counts are described below. All PM bits and counts are read-only and default to zero. They are updated on the i second tick. If there is no tick, the register value will not change. The "tick" is either the rising edge of the PM_CLK or the change from 0 to 1 in bit of register 001h, depending on which mode is enabled by the Micro Present byte and bit 1 of the Global Control register, address 001h.

TABLE 15

ADDR = 0x012: PM Register

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | --used-- | | | | | | | LOS PM | OOF PM | B1 PM | B2 PM | AIS PM | REI PM | RDI PM | Incosistent J0 PM | Mismatched J0 PM |
| Mode | ro | ro | ro | ro | ro | ro | ro | ro | ro | ro | ro | ro | ro | ro | ro | ro |
| Default | 0 | 0 | 0 | 0 | 0 | 0 | 0 | 0 | 0 | 0 | 0 | 0 | 0 | 0 | 0 | 0 |

These bits are set if the corresponding failures occurred since the last 1 second tick.

See GR-253 sections 6.2.2.3 and 6.2.2.4 for full descriptions of SONET/SDH PMs. Note that the J0 PMs are not defined in the SONET/SDH standards yet.

TABLE 16

ADDR = 0x013: B1 Error PM Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | Count | | | | | | | | | | | | | | | |

Contains the B1 error count.

TABLE 17

ADDR = 0x014–0x15: B2 Error PM Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | | | | | | | MSB | | | | | |
| Name | LSB | | | | | | | | | | | | | | | |

Contains the B2 error count.

TABLE 18

ADDR = 0x016–0x17: REI_L PM Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | | | | | | | MSB | | | | | |
| Name | LSB | | | | | | | | | | | | | | | |

Contains the REI_L count.

Validated Bytes

If a new value is of K1/KS or S1 is found and consecutively repeated (3 times for K1/K2 and 8 times for S1) the new value will be stored in the Validated Registers for software to read.

The first read of these registers will likely result in the actual validated values rather than the default value.

TABLE 19

ADDR = 0x018: Validated K1/K2 Value

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | Validated K1 | | | | | | | | Validated K2 | | | | | | | |
| Mode | ro | ro | ro | ro | ro | ro | ro | ro | ro | ro | ro | ro | ro | ro | ro | ro |
| Default | 0 | 0 | 0 | 0 | 0 | 0 | 0 | 0 | 0 | 0 | 0 | 0 | 0 | 0 | 0 | 0 |

Contains the validated K1 and K2 bytes.

TABLE 20

ADDR = 0x019: Validated S1 Value

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | | | | | Validated S1 | | | | | | | |
| Mode | ro | ro | ro | ro | ro | ro | ro | ro | ro | ro | ro | ro | ro | ro | ro | ro |
| Default | 0 | 0 | 0 | 0 | 0 | 0 | 0 | 0 | 0 | 0 | 0 | 0 | 0 | 0 | 0 | 0 |

Contains the validated S1 synchronization byte.

TABLE 21

ADDR = 0x01B: Gigabit Ethernet Invalid Code Word PM Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | Count | | | | | | | | | | | | | | | |

Contains the number of GBE Invalid Code Words that were detected.

TABLE 22

ADDR = 0x01C: Gigabit Ethernet Disparity Error PM Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | Count | | | | | | | | | | | | | | | |

Contains the number of GBE Disparity Errors that were detected.

TABLE 23

ADDR = 0x01D: Gigabit Ethernet Sync Loss PM Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | Count | | | | | | | | | | | | | | | |

This is a count of the transitions from in-sync to out-of-sync.

TABLE 24

ADDR = 0x01E: Combined Gigabit Ethernet PM Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | Count | | | | | | | | | | | | | | | |

The invalid-code and disparity errors are ORed together and the resultant error is counted.

TABLE 25

ADDR = 0x030–0x031: Corrected Ones Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | MSB | | | | | | | | | | | |
| | LSB | | | | | | | | | | | | | | | |

Contains the number of ones that were corrected by the FEC block.

TABLE 26

ADDR = 0x032–0x033: Corrected Zeros Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | MSB | | | | | | | | | | | |
| | LSB | | | | | | | | | | | | | | | |

Contains the number of zeros that were corrected by the FEC block.

TABLE 27

ADDR = 0x034–0x035: Total Corrected Bits Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | MSB | | | | | | | | | | | |
| | LSB | | | | | | | | | | | | | | | |

Contains the total number of bits that were corrected by the FEC block.

TABLE 28

ADDR = 0x036–0x037: Total Corrected Bytes Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | | | | MSB | | | | | | | | |
| | LSB | | | | | | | | | | | | | | | |

Contains the total number of bytes that were corrected by the FEC block.

TABLE 29

ADDR = 0x038–0x039: Uncorrectable 255-Byte Block Count

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Name | unused | | | | | | | | MSB | | | | | | | |
| | LSB | | | | | | | | | | | | | | | |

Contains the total number of uncorrectable bytes that were detected by the FEC block.

TABLE 30

ADDR = 0x080–0x09F: Expected Section Trace Message

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 080 | First byte of message | | | | | | | | Second byte of message | | | | | | | |
| 081 | Third byte of message | | | | | | | | Fourth byte of message | | | | | | | |
| ... | ... | | | | | | | | ... | | | | | | | |
| 09f | 63rd byte of message | | | | | | | | 64th byte of message | | | | | | | |
| Mode | rw | rw | rw | rw | rw | rw | rw | rw | rw | rw | rw | rw | rw | rw | rw | rw |
| Default | 0 | 0 | 0 | 0 | 0 | 0 | 0 | 0 | 0 | 0 | 0 | 0 | 0 | 0 | 0 | 0 |

Contains the expected section trace message that was programmed via software.

TABLE 31

ADDR = 0x0A0–0x0BF: Received Section Trace Message

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0a0 | First byte of message | | | | | | | | Second byte of message | | | | | | | |
| 0a1 | Third byte of message | | | | | | | | Fourth byte of message | | | | | | | |
| ... | ... | | | | | | | | ... | | | | | | | |
| 0bf | 63rd byte of message | | | | | | | | 64th byte of message | | | | | | | |
| Mode | ro | ro | ro | ro | ro | ro | ro | ro | ro | ro | ro | ro | ro | ro | ro | ro |
| Default | 0 | 0 | 0 | 0 | 0 | 0 | 0 | 0 | 0 | 0 | 0 | 0 | 0 | 0 | 0 | 0 |

If there is a mismatch interrupt showing, this memory will contain the mismatched message.
If there are no errors showing, this memory will show the expected message (unless a power-up reset has just occurred).
If there is an inconsistent interrupt showing, this memory will contain the last valid message, or, if no valid messages have been received since the last reset, random data.

TABLE 32

ADDR = 0x0C0–0x0DF: Transmit Section Trace Message

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0c0 | First byte of message | | | | | | | | Second byte of message | | | | | | | |
| 0c1 | Third byte of message | | | | | | | | Fourth byte of message | | | | | | | |
| ... | ... | | | | | | | | ... | | | | | | | |
| 0df | 63rd byte of message | | | | | | | | 64th byte of message | | | | | | | |
| Mode | rw | rw | rw | rw | rw | rw | rw | rw | rw | rw | rw | rw | rw | rw | rw | rw |
| Default | 0 | 0 | 0 | 0 | 0 | 0 | 0 | 0 | 0 | 0 | 0 | 0 | 0 | 0 | 0 | 0 |

Contains the section trace message to be transmitted that was programmed via software.

A system and method for monitoring the performance of communications, Independent of protocol has been provided. The concepts of the present invention presented above have been embedded in the context of the S3062 integrated circuit. However, the principles the invention are not limited to use in a monolithic device. Neither are the principles limited to the specific design choices and implementations of the S3062. Other embodiments and variations of the present invention will occur to those skilled in the art.

What is claimed is:

1. A method for monitoring communications, the method comprising:

receiving a first stream of information in a first communication protocol;

selectively engaging Forward Error Correction (FEC) processing to perform FEC processing of the first stream of information, independent of the first communication protocol; and selectively monitoring the performance of the first stream of information; in which:

selectively monitoring the performance of the first stream of information includes selectively monitoring the performance of the FEC processing; and selectively monitoring the performance of the FEC processing includes analyzing errors selected from the group consisting of "1"s count, "0"s count, the count of uncorrectable frames, the total of corrected bits, and the total of corrected bytes.

2. The method of claim 1 further comprising:

selectively decoding of the first stream of information; and in which the FEC processing includes selectively correcting the selectively decoded first information stream.

3. The method of claim 1 further comprising:

following selectively engaging FEC processing, selectively encoding the first stream of information.

4. The method of claim 1 further comprising:

following selectively engaging FEC processing, transmitting the first stream of information as a second stream of information.

5. The method of claim 1 in which selectively engaging FEC processing includes using a Reed Solomon (RS) FEC scheme.

6. The method of claim 5 in which selectively monitoring the performance of the FEC processing includes monitoring FEC performance independent of the data rate of the first stream of information.

7. A method for monitoring communications, the method comprising:

receiving a first stream of information in a first communication protocol;

selectively engaging Forward Error Correction (FEC) processing of the first stream of information, independent of the first communication protocol;

selectively monitoring the performance of the first stream of information;

deinterleaving the first stream of information into a plurality of n parallel data streams; and following selectively engaging FEC processing, interleaving the plurality of n parallel data streams into a second stream of information.

8. The method of claim 7 further comprising:

organizing the first stream of information into a first frame structure including data sections and parity sections; and using information in the parity sections, correcting errors detected in the received first stream of information.

9. The method of claim 8 in which the first stream of information is deinterleaved into four parallel data streams;

in which the four parallel data streams are organized into a first frame structure with a data section including a plurality of p bytes and parity section including a plurality of q bytes.

10. The method of claim 9 in which the organization of the four parallel data streams into a first frame structure includes forming a block of 255 bytes in each data stream, with the plurality of p and q bytes varying to permit FEC of three to eight bytes in each block.

11. The method of claim 7 in which the FEC processing includes using a Reed Solomon (RS) FEC scheme.

12. A method for monitoring communications, the method comprising:

receiving a first stream of information stream in a SONET/SDH communication protocol;

selectively engaging Forward Error Correction (FEC) processing of the first stream of information, independent of the SONET/SDH communication protocol; and selectively monitoring the performance of the first stream of information;

in which selectively monitoring the performance of the first stream of information includes selectively monitoring the first stream of information for errors selected from the group consisting of trace section message errors, synchronization errors, frame alignment errors, byte alignment errors, B1 and B2 bit errors, bit error rate (BER) calculations, Alarm Indication Signal (AIS) errors, and Remote Error Indicator (REI) errors.

13. A method for monitoring communications, the method comprising:

receiving a first stream of information stream in a communication protocol selected from the group consisting of Gigabit Ethernet and fiber channel protocols;

selectively engaging Forward Error Correction (FEC) processing of the first stream of information, independent of the communication protocol; and selectively monitoring the performance of the first stream of information;

in which selectively monitoring the performance of the first stream of information includes selectively monitoring the first stream of information for errors selected from the group consisting of synchronization errors and invalid code word errors.

14. A method for monitoring communications, the method comprising:

receiving a first stream of information stream in a communication protocol selected from the group consisting of Gigabit Ethernet and fiber channel protocols;

selectively engaging Forward Error Correction (FEC) processing of the first stream of information, independent of the communication protocol; and selectively monitoring the performance of the first stream of information;

in which the reception of the first stream of information includes receiving the first information stream at rates in the range from 100 Megabits per second (Mbs/s) to 2.67 Gigabits/s.

15. An integrated circuit (IC) performance monitor comprising:

an input port to accept a first stream of information according to a communication protocol; and a selectively enabled Forward Error Correction (FEC) circuit having an input connected to the input port to receive the first stream of information, the FEC circuit having a monitor port and an output to provide a corrected stream of information, independent of the communication protocol, when the FEC circuit is enabled;

a selectively enabled decoding circuit having an input connected to said input port to accept the first stream of information, the decoding circuit having an output and providing a decoded first information stream at said output when the decoding circuit is enabled; and in which the input of the selectively enabled FEC circuit is connected to the output of the selectively enabled decoding circuit to selectively correct the decoded first information stream;

a selectively enabled encoding circuit having an input selectively connected to the input port, and to the outputs of the selectively enabled decoder and FEC circuits, the encoding circuit providing an encoded information stream at an output when the encoding circuit is enabled;

an output port selectively connected to the input port and to the outputs of the selectively enabled decoder, FEC, and encoder circuits; and a selectively enabled FEC performance monitor circuit having an input connected to the monitor port of the FEC circuit to evaluate the corrections being made by the FEC circuit when it is engaged;

the FEC performance monitor circuit for analyzing errors selected from the group consisting of "1"s count, "0"s count, the count of uncorrectable frames, the total of corrected bits, and the total of corrected bytes.

16. The performance monitor of claim 15 in which the FEC circuit processes the first information stream using a Reed Solomon (RS) FEC scheme, when enabled.

17. An integrated circuit (IC) performance monitor comprising:

an input port to accept a first stream of information according to a communication protocol; and a selectively enabled Forward Error Correction (FEC) circuit having an input connected to the input port to receive the first stream of information, the FEC circuit having a monitor port and an output to provide a corrected stream of information, independent of the communication protocol, when the FEC circuit is enabled;

a selectively enabled decoding circuit having an input connected to said input port to accept the first stream of information, the decoding circuit having an output and providing a decoded first information stream at said output when the decoding circuit is enabled; and in which the input of the selectively enabled FEC circuit is connected to the output of the selectively enabled decoding circuit to selectively correct the decoded first information stream;

a selectively enabled encoding circuit having an input selectively connected to the input port, and to the outputs of the selectively enabled decoder and FEC circuits, the encoding circuit providing an encoded information stream at an output when the encoding circuit is enabled;

an output port selectively connected to the input port and to the outputs of the selectively enabled decoder, FEC, and encoder circuits; and a selectively enabled FEC performance monitor circuit having an input connected to the monitor port of the FEC circuit to evaluate the corrections being made by the FEC circuit when it is engaged;

a deinterleaver circuit having an input connected to the input port, the deinterleaver circuit deinterleaving the first stream of information into a plurality of n parallel data streams at a plurality of n outputs; and an interleaver circuit having a plurality of n inputs to accept a plurality of n parallel data streams, the interleaver circuit having a output connected to the output port to provide the interleaved plurality of n parallel data streams into a second stream of information.

18. The performance monitor of claim 17 in which the selectively enabled FEC circuit has a plurality of n inputs and a plurality of n outputs, and in the FEC circuit organizes the first stream of information into a first frame structure including data sections and parity sections in each of the n data streams, when engaged, and in which the FEC circuit uses information in the parity sections to correct errors detected in the first stream of information.

19. The performance monitor of claim 18 in which the deinterleaver circuit deinterleaves the first stream of information into four parallel data streams;

in which the FEC circuit organizes the four parallel data streams into a first frame structure with a data section including a plurality of p bytes and parity section including a plurality of q bytes, when engaged.

20. The performance monitor of claim 19 in which the FEC circuit organization of the four parallel data streams into a first frame structure includes forming a block of 255 bytes in each data stream, with the plurality of p and q bytes varying to permit FEC of three to eight bytes in each block, when engaged.

21. An integrated circuit (IC) performance monitor comprising:

an input port to accept a first stream of information according to a communication protocol; and a selectively enabled Forward Error Correction (FEC) circuit having an input connected to the input port to receive the first stream of information, the FEC circuit having an output to provide a corrected stream of information, independent of the communication protocol, when the FEC circuit is enabled;

a selectively enabled SONET/SDH performance monitoring circuit having a monitor port and an input port selectively connectable to the input port and to the output of the selectively enabled FEC circuit, the SONET/SDH performance monitoring circuit providing an analysis of SONET/SDH protocol errors at the monitor port, when enabled.

22. The performance monitor of claim 21 in which the selectively enabled SONET/SDH performance monitoring circuit has an output to provide the analyzed first information stream.

23. The performance monitor of claim 21 in which the SONET/SDH performance monitoring circuit analyzes the first stream of information for errors selected from the group consisting of trace section message errors, synchronization errors, frame alignment errors, byte alignment errors, B1 and B2 bit errors, bit error rate (BER) calculations, Alarm Indication Signal (AIS) errors, and Remote Error Indicator (REI) errors.

24. An integrated circuit (IC) performance monitor comprising:

an input port to accept a first stream of information according to a communication protocol; and a selectively enabled Forward Error Correction (FEC) circuit having an input connected to the input port to receive the first stream of information, the FEC circuit having an output to provide a corrected stream of information, independent of the communication protocol, when the FEC circuit is enabled;

a selectively enabled Gigabit Ethernet (GBE) performance monitoring circuit having a monitor port and an input port selectively connectable to the input port and to the output of the selectively enabled FEC circuit, the GBE performance monitoring circuit providing an analysis of GBE and fiber channel protocol errors at the monitor port, when enabled.

25. The performance monitor of claim 24 in which the GBE performance monitoring circuit analyzes the first stream of information for errors selected from the group consisting of synchronization errors and invalid code word errors.

26. An integrated circuit (IC) performance monitor comprising:
   an input port to accept a first stream of information in a communication protocol; and
   a selectively enabled Forward Error Correction (FEC) circuit having an input connected to the input port to receive the first stream of information, the FEC circuit having an output to provide a corrected stream of information, independent of the communication protocol, when the FEC circuit is enabled;
   in which the FEC circuit receives the first stream of information at rates in the range from 100 Megabits per second (Mbs/s) to 2.67 Gigabits/s, when enabled.

27. A system for monitoring communication performance comprising;
   a transmitter having an output to provide a first stream of information according to a communication protocol;
   a performance monitor including;
      an input port connected to the transmitter output to accept the first stream of information;
      a selectably enabled Forward Error Correction (FEC) circuit having an input operatively connected to the input port to receive the first stream of information, the FEC circuit having a output to provide a corrected stream of information, independent of the communication protocol, when the FEC is enabled; and
      a selectively enabled SONET/SDH performance monitoring circuit having a monitor port and an input operatively connected to the input port, the SONET/SDH performance monitoring circuit for providing an analysis of SONET/SDH protocol errors in the first stream of information at the monitor port, when enabled.

28. The system of claim 27 in which the performance monitor further includes:
   a selectively enabled decoding circuit having an input operatively connected to input port to accept the first stream of information, the decoding circuit providing a decoded first information stream at an output when the decoding circuit is enabled.

29. The system of claim 27 in which the performance monitor further includes:
   a selectively enabled encoding circuit having an input operatively connected to input port, the encoding circuit providing an encoded information stream at an output when the encoding circuit is enabled.

30. The system of claim 27 in which the performance monitor further includes:
   a selectively enabled FEC performance monitor circuit having an input connected to the monitor port of the selectively enabled FEC circuit to evaluate the corrections being made by the FEC circuit when it is engaged.

31. The system of claim 27 in which the performance monitor further includes:
   an output port operatively connected to the input port to provide a second stream of information.

32. The system of claim 31 further comprising:
   a receiver having an input port connected to the output port of the performance monitor to accept the second stream of information.

33. A system for monitoring communication performance comprising;
   a transmitter having an output to provide a first stream of information according to a communication protocol;
   a performance monitor including;
      an input port connected to the transmitter output to accept the first stream of information;
      a selectably enabled Forward Error Correction (FEC) circuit having an input operatively connected to the input port to receive the first stream of information, the FEC circuit having a output to provide a corrected stream of information, independent of the communication protocol, when the FEC is enabled; and
      a selectively enabled Gigabit Ethernet (GBE) performance monitoring circuit having a monitor port and an input operatively connected to the input port, the GBE performance monitoring circuit providing an analysis of GBE and fiber channel protocol errors at the monitor port, when enabled.

* * * * *